US012740074B2

(12) United States Patent
Kiyomura et al.

(10) Patent No.: US 12,740,074 B2
(45) Date of Patent: Sep. 15, 2026

(54) SEMICONDUCTOR DEVICE

(71) Applicant: Kioxia Corporation, Tokyo (JP)

(72) Inventors: Yuya Kiyomura, Kuwana Mie (JP); Ayako Kawanishi, Yokkaichi Mie (JP); Yuta Taguchi, Yokkaichi Mie (JP); Ayumi Watarai, Ama Aichi (JP); Ippei Kume, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 373 days.

(21) Appl. No.: 18/586,366

(22) Filed: Feb. 23, 2024

(65) Prior Publication Data

US 2024/0304576 A1 Sep. 12, 2024

(30) Foreign Application Priority Data

Mar. 10, 2023 (JP) ................................ 2023-037602

(51) Int. Cl.

| | |
|---|---|
| ***H01L 23/02*** | (2006.01) |
| ***H10B 80/00*** | (2023.01) |
| ***H10W 90/00*** | (2026.01) |
| *H10W 72/00* | (2026.01) |
| *H10W 72/90* | (2026.01) |

(52) U.S. Cl.

CPC ............ *H10B 80/00* (2023.02); *H10W 90/00* (2026.01); *H10W 72/019* (2026.01); *H10W 72/9226* (2026.01); *H10W 72/923* (2026.01); *H10W 72/9232* (2026.01); *H10W 72/934* (2026.01); *H10W 72/952* (2026.01); *H10W 90/792* (2026.01)

(58) Field of Classification Search

CPC .. H10B 80/00; H10W 90/00; H10W 72/9232; H10W 72/923; H10W 72/019; H10W 90/792; H10W 72/9226; H10W 72/934; H10W 72/015; H10W 72/07555; H10W 72/50; H10W 72/551; H10W 72/5522; H10W 72/59; H10W 72/952; H10W 20/01; H10W 20/033; H10W 20/038; H10W 20/045; H10W 20/48

See application file for complete search history.

(56) References Cited

U.S. PATENT DOCUMENTS

| | | | | |
|---|---|---|---|---|
| 2016/0013099 A1* | 1/2016 | Tanida | ................ | H10W 70/093 438/107 |
| 2020/0294971 A1 | 9/2020 | Tanaka et al. | | |
| 2021/0074675 A1* | 3/2021 | Shini | ................ | H10W 72/0198 |

FOREIGN PATENT DOCUMENTS

| | | |
|---|---|---|
| JP | 2020-150226 A | 9/2020 |
| JP | 2021-044347 A | 3/2021 |

* cited by examiner

*Primary Examiner* — Niki H Nguyen

(74) *Attorney, Agent, or Firm* — Kim & Stewart LLP

(57) ABSTRACT

A memory device includes a first chip including a first electrode and a second chip including a second electrode. The first electrode includes a first conductive film having a first surface in contact with the second electrode at a boundary region of the first and second electrodes, a second surface spaced apart from the boundary region, and a third surface between the first surface and the second surface, and having a first portion on the first surface side and a second portion on the second surface side, and includes a second conductive film covering the second surface and the third surface of the first conductive film. A (111) orientation ratio of copper contained in the first portion is higher than a (111) orientation ratio of copper contained in the second portion.

20 Claims, 23 Drawing Sheets

FIG. 3

SEMICONDUCTOR DEVICE

CROSS-REFERENCE TO RELATED APPLICATION(S)

This application is based upon and claims the benefit of priority from Japanese Patent Application No. 2023-037602, filed Mar. 10, 2023, the entire contents of which are incorporated herein by reference.

FIELD

Embodiments described herein relate generally to a semiconductor device.

BACKGROUND

A semiconductor device that includes two chips bonded together is known. The chips are electrically connected to each other through a bonding pad.

DESCRIPTION OF THE DRAWINGS

FIG. 3 is a perspective view showing an outline of a bonding structure of a memory chip and a circuit chip in the memory device according to the first embodiment.

DETAILED DESCRIPTION

Figure 1:
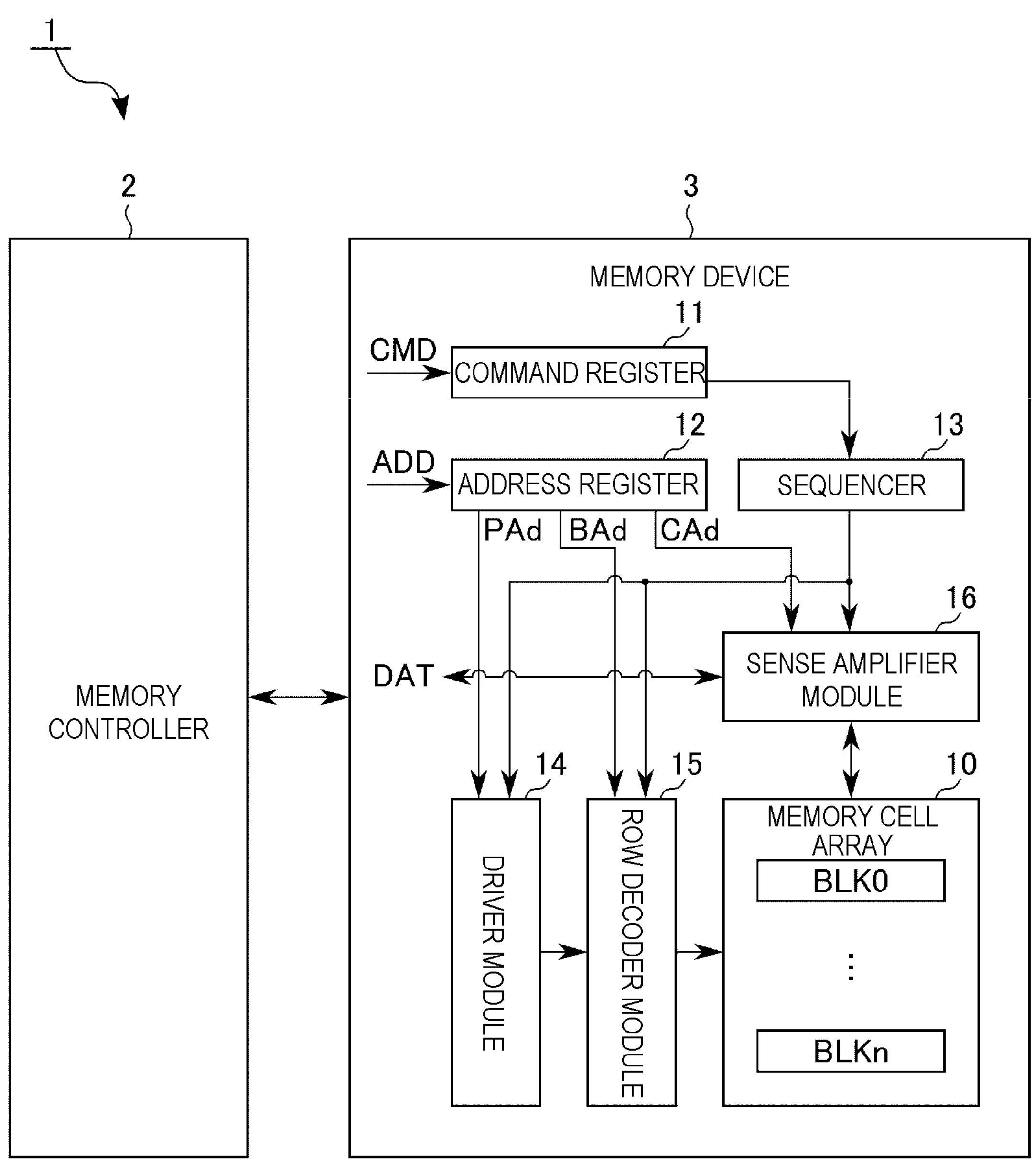
FIG. 1 is a block diagram showing an example of a configuration of a memory system including a memory device according to a first embodiment.

In general, according to one embodiment, the semiconductor device includes a first chip including a first electrode and a second chip including a second electrode. The first electrode includes a first conductive film and a second conductive film. The first conductive film has a first surface in contact with the second electrode at a boundary region of the first and second electrodes, a second surface spaced apart from the boundary region, and a third surface between the first surface and the second surface. The second conductive film covers the second surface and the third surface of the first conductive film. An (111) orientation ratio of copper contained in a first portion of the first conductive film on a first surface side is higher than the (111) orientation ratio of copper contained in a second portion of the first conductive film on the second surface side.

Hereinafter, embodiments will be described with reference to drawings. The dimensions and ratios of each drawing are not necessarily the same as actual ones.

In the following description, the same reference numerals are added to elements having substantially the same function and configuration. Letters or numerals different from each other may be added to the end of the same reference numerals when distinguishing between elements having similar configurations.

1. FIRST EMBODIMENT

1.1 Configuration

1.1.1 Configuration of Memory System

FIG. 1 is a block diagram showing an example of a configuration of a memory system including a memory device according to a first embodiment. The memory system 1 is a storage device configured to be connected to an external host (not illustrated). The memory system 1 is, for example, a memory card such as an SD®, a universal flash storage (UFS), or a solid state drive (SSD). The memory system 1 includes a memory controller 2 and a memory device 3.

The memory controller 2 is implemented by, for example, an integrated circuit such as a system-on-a-chip (SoC). The memory controller 2 controls the memory device 3 based on a request from the host. Specifically, for example, the memory controller 2 writes the data requested to be written from the host into the memory device 3. The memory controller 2 reads data requested by the host to be read, from the memory device 3 and transmits the data to the host.

The memory device 3 is a semiconductor storage device which is an example of a semiconductor device. The memory device 3 is, for example, a NAND flash memory. The memory device 3 is a nonvolatile memory that stores data in a nonvolatile manner.

Communication interface between the memory controller 2 and the memory device 3 is, for example, a single data rate (SDR) interface, a toggle double data rate (DDR) interface, or an open NAND flash interface (ONFI).

1.1.2 Configuration of Memory Device

Subsequently, an internal configuration of the memory device according to the first embodiment will be described with reference to the block diagram shown in FIG. 1. The memory device 3 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (n is an integer equal to or larger than 1). The number of blocks BLK in the memory cell array 10 may be one. The block BLK is a set of a plurality of memory cells. The block BLK is a data erasing unit, for example. A plurality of bit lines and a plurality of word lines are provided in the memory cell array 10. Each memory cell is associated with, for example, one bit line and one word line. A detailed configuration of the memory cell array 10 will be described later.

The command register 11 stores the command CMD received from the memory controller 2 by the memory device 3. The command CMD includes, for example, an instruction to cause the sequencer 13 to perform a read operation, a write operation, an erasing operation, and the like.

The address register 12 stores the address information ADD received from the memory controller 2 by the memory device 3. The address information ADD includes, for example, a block address BAd, a page address PAd, and a column address CAd. For example, the block address BAd, the page address PAd, and the column address CAd are used to select the block BLK, the word line, and the bit line, respectively.

The sequencer 13 controls the operation of the entire memory device 3. For example, the sequencer 13 controls the driver module 14, the row decoder module 15, the sense amplifier module 16, and the like based on the command CMD stored in the command register 11 to execute a read operation, a write operation, an erasing operation, and the like.

The driver module 14 generates voltages used in the read operation, the write operation, the erasing operation, and the like. The driver module 14 applies the generated voltage to a signal line corresponding to the selected word line, based on the page address PAd stored in the address register 12, for example.

The row decoder module 15 selects one block BLK in the corresponding memory cell array 10 based on the block address BAd stored in the address register 12. The row decoder module 15 transfers, for example, the voltage applied to the signal line corresponding to the selected word line, to the selected word line in the selected block BLK.

In the write operation, the sense amplifier module 16 applies a desired voltage to each bit line in response to the write data DAT received from the memory controller 2. In addition, in the read operation, the sense amplifier module 16 determines the data stored in the memory cell based on the voltage of the bit line, and transfers the determination result to the memory controller 2 as read data DAT.

1.1.3 Circuit Configuration of Memory Cell Array

Figure 2:
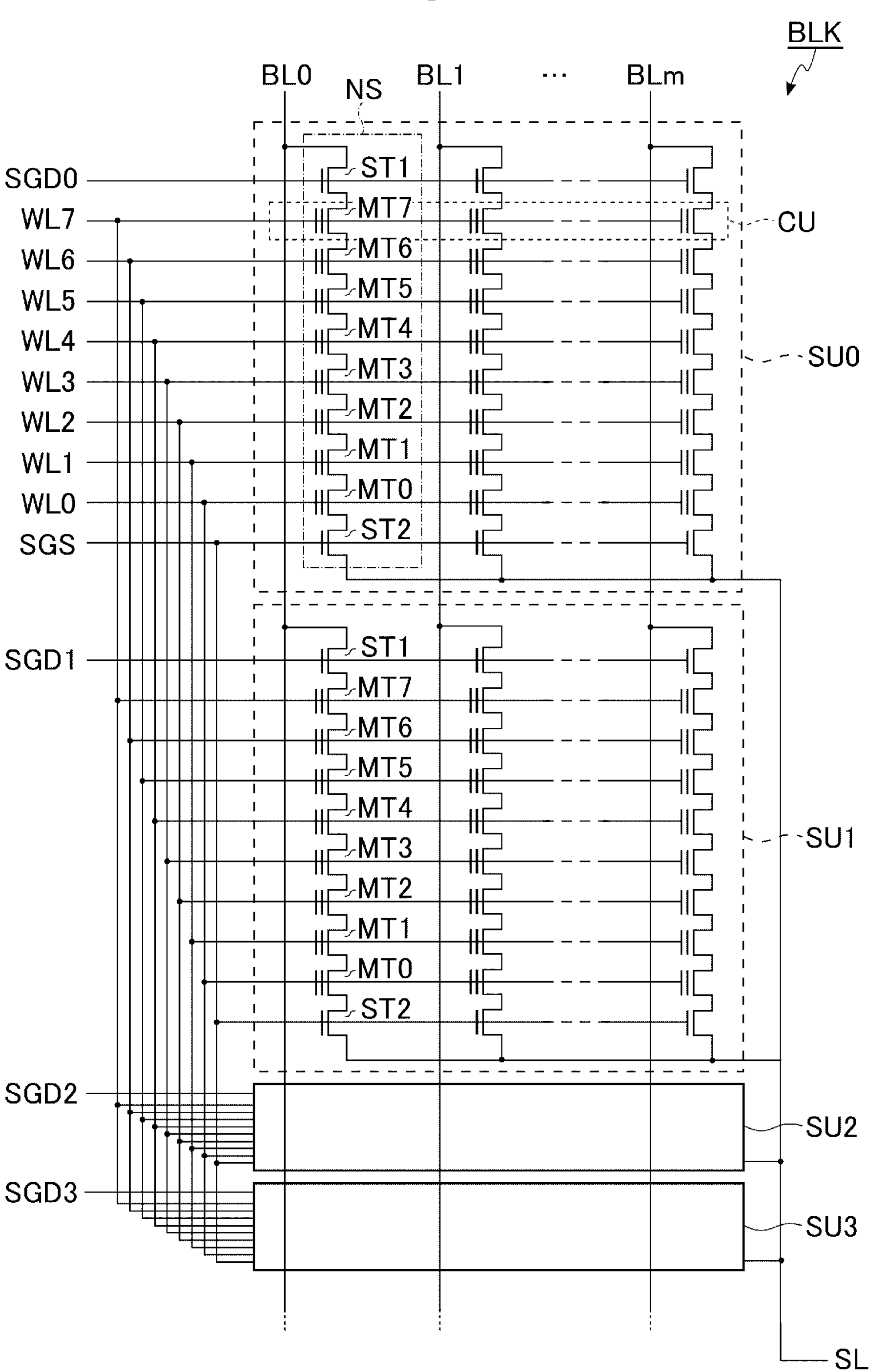
FIG. 2 is a circuit diagram showing an example of a circuit configuration of a memory cell array in the memory device according to the first embodiment.

FIG. 2 is a circuit diagram showing an example of the circuit configuration of the memory cell array contained in the memory device according to the first embodiment. FIG. 2 shows one block BLK among a plurality of blocks BLK in the memory cell array 10. As shown in FIG. 2, the block BLK includes, for example, four string units SU0 to SU3.

Each string unit SU includes a plurality of NAND strings NS associated with bit lines BL0 to BLm (where m is an integer of 1 or more). The number of the bit lines BL may be one. Each NAND string NS includes, for example, memory cell transistors MT0 to MT7 and select transistors ST1 and ST2. Each memory cell transistor MT includes a control gate and a charge storage portion, and stores data in a non-volatile manner. Each of the select transistors ST1 and ST2 is used for selecting the string unit SU when performing the various operations.

The memory cell transistors MT0 to MT7 in each NAND string NS are connected in series. A drain of the select transistor ST1 is connected to the associated bit line BL. The source of the select transistor ST1 is connected to one end of the memory cell transistors MT0 to MT7 connected in series. The drain of the select transistor ST2 is connected to the other end of the memory cell transistors MT0 to MT7 connected in series. A source of the select transistor ST2 is connected to the source line SL.

The control gates of the memory cell transistors MT0 to MT7 in the same block BLK are connected to word lines WL0 to WL7, respectively. The gates of the select transistors ST1 in the respective string units SU0 to SU3 are connected to select gate lines SGD0 to SGD3. The gates of a plurality of the select transistors ST2 are connected to the select gate line SGS.

Different column addresses are assigned to the respective bit lines BL0 to BLm. Each of the bit lines BL is shared by the NAND string NS to which the same column address is assigned among the plurality of blocks BLK. Each of the word lines WL0 to WL7 is provided for each block BLK. The source line SL is shared among, for example, the plurality of blocks BLK.

A set of a plurality of memory cell transistors MT connected to a common word line WL in the same string unit SU is referred to as, for example, a "cell unit CU". For example, a storage capacity of the cell unit CU that includes the memory cell transistors MT, each of which stores one bit data, is defined as "one page data". The cell unit CU may have a storage capacity of two or more pages of data according to the number of bits of data stored in the memory cell transistor MT.

The circuit configuration of the memory cell array 10 contained in the memory device 3 according to the first embodiment is not limited to the configuration described above. For example, each block BLK may be designed to include any number of string units SU. Each NAND string NS may be designed to include any number of memory cell transistors MT and select transistors ST1 and ST2.

1.1.4 Stacking Structure of Memory Device

Figure 3:
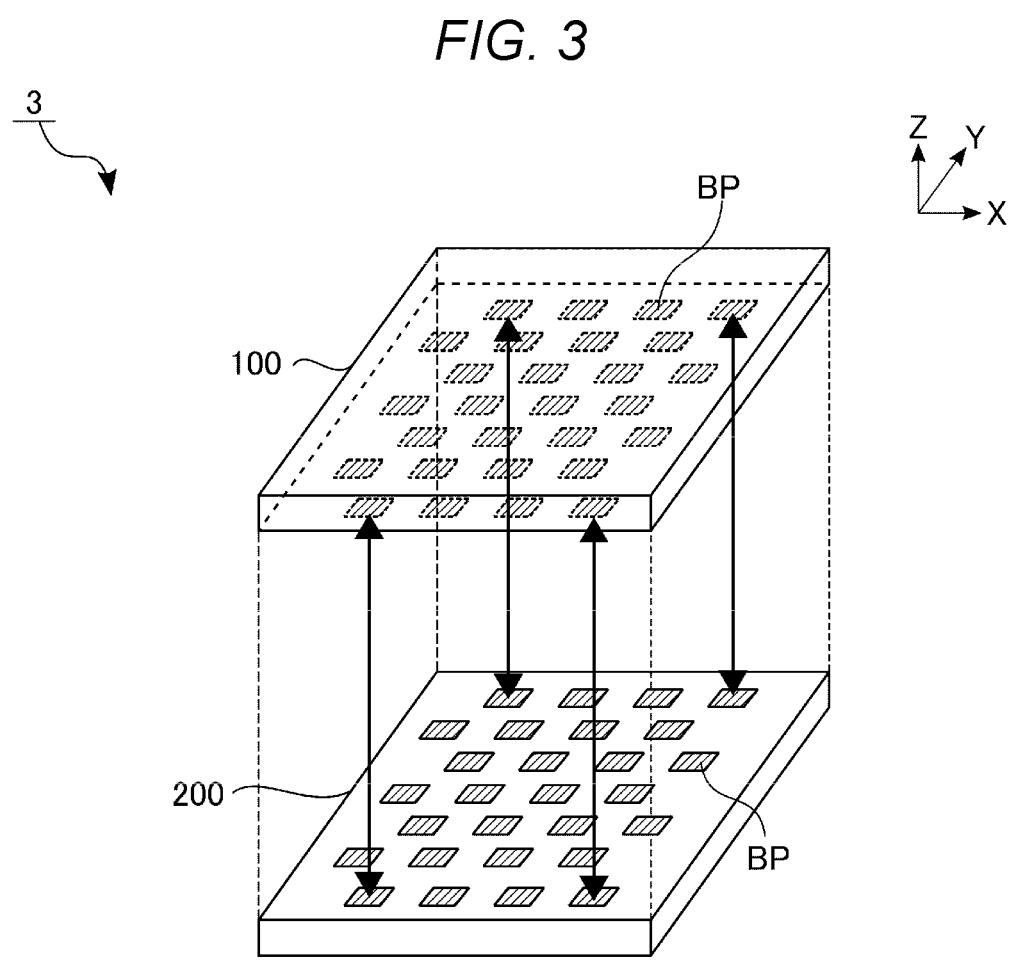

FIG. 3 is a perspective view showing an outline of a bonding structure of the memory device according to the first embodiment.

As shown in FIG. 3, the memory device 3 includes a memory chip 100 and a circuit chip 200. The memory chip 100 includes the memory cell array 10. The circuit chip 200 includes a command register 11, an address register 12, a sequencer 13, a driver module 14, a row decoder module 15, and a sense amplifier module 16, for example.

In addition, each of the memory chip 100 and the circuit chip 200 includes a plurality of bonding pads BP. The memory device 3 is formed by bonding the memory chip 100 and the circuit chip 200 through a plurality of bonding pads BP.

Hereinafter, a plane parallel to a surface on which the memory chip 100 and the circuit chip 200 are bonded (referred to herein as a bonding surface) is referred to as an XY plane. Directions orthogonal to each other on the XY plane are referred to as an X direction and a Y direction. In addition, a direction substantially perpendicular to the XY plane is referred to as a Z direction. In addition, for convenience of description, in the Z direction, a direction from the circuit chip 200 toward the memory chip 100 is referred to as an upward direction, and a direction from the memory chip 100 toward the circuit chip 200 is referred to as a downward direction.

1.1.5 Cross-Sectional Structure of Bonding Pad

Next, a cross-sectional structure of the bonding pad BP will be described.

Figure 4:
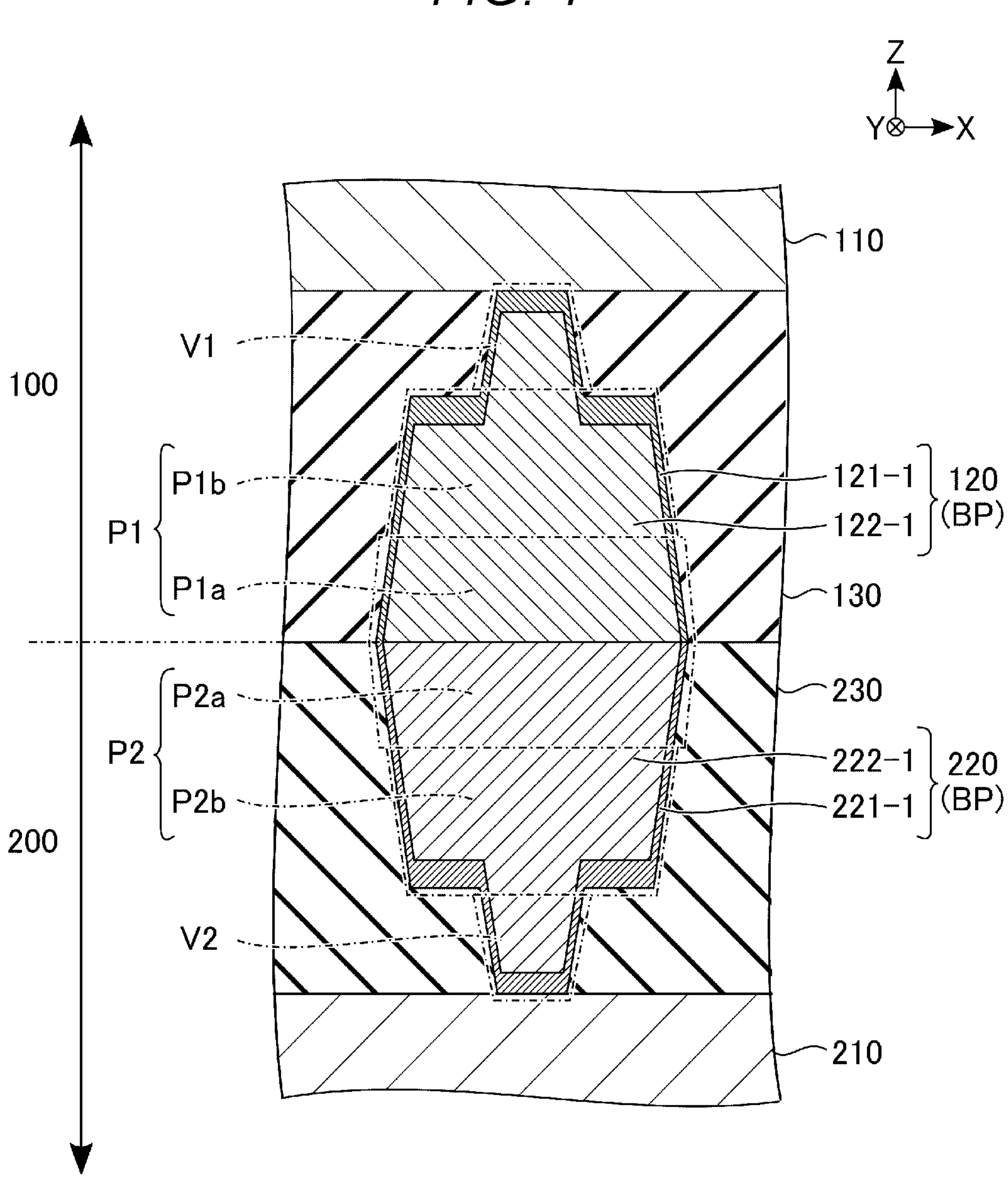
FIG. 4 is a cross-sectional view showing an example of a cross-sectional structure of a bonding pad in the memory device according to the first embodiment.

FIG. 4 is a cross-sectional diagram showing an example of a cross-sectional structure of a bonding pad of the memory device according to the first embodiment. In the example of FIG. 4, a cross-sectional structure representing a set of bonding pads BP electrically connecting the memory chip 100 and the circuit chip 200 to each other via a bonding surface is shown. As shown in FIG. 4, the memory chip 100 includes a wiring layer 110, an electrode 120, and an insulating layer 130. The circuit chip 200 includes a wiring layer 210, an electrode 220, and an insulating layer 230.

First, a configuration on the memory chip 100 side will be described.

The wiring layer 110 includes, for example, copper or tungsten as a conductive material. The electrode 120 is provided on the lower surface of the wiring layer 110.

The electrode 120 is used as a bonding pad BP on the memory chip 100 side. The electrode 120 extends in the Z direction. The electrode 120 is classified into a via portion V1 and a pad portion P1. The pad portion P1 is further classified into the interface portion P1_a_ and the bottom portion P1_b_. The interface portion P1_a_ has a bonding surface. The bottom portion P1_b_ is located on a side opposite to the bonding surface with respect to the interface portion P1_a_, and connects the interface portion P1_a_ and the via portion V1. The via portion V1 is located on a side opposite to the bonding surface with respect to the bottom portion P1_b_. The upper surface of the bottom portion P1_b_ and the upper surface of the via portion V1 are spaced apart from the lower surface (that is, the bonding surface) of the interface portion P1_a_. The side surface of the interface portion P1_a_ substantially coincides with an extension of the side surface of the bottom portion P1_b_. The side surface of the via portion V1 does not coincide with the extension of the side surface of the pad portion P1. The upper surface of the via portion V1 is in contact with the wiring layer 110. A lower surface of the interface portion P1_a_ is in contact with the electrode 220. The side surface of the via portion V1, the upper surface and the side surface of the bottom portion P1_b_, and the side surface of the interface portion P1_a_ are in contact with the insulating layer 130.

The upper surface of the via portion V1 is smaller than the boundary between the bottom portion P1_b_ and the via portion V1 when the upper surface is viewed in the Z direction. The upper surface of the bottom portion P1_b_ including the boundary between the bottom portion P1_b_ and the via portion V1 is smaller than the lower surface of the interface portion P1_a_ when the boundary is viewed in the Z direction. That is, the side surface of the pad portion P1 and the side surface of the via portion V1 have a tapered shape.

In addition, the electrode 120 includes a barrier metal film 121-1 and a core metal film 122-1.

The barrier metal film 121-1 is a single-layer conductive film covering the entire surface of the core metal film 122-1 except for the bonding surface. The lower end of the barrier metal film 121-1 reaches the bonding surface. The barrier metal film 121-1 is provided between the core metal film 122-1 and the insulating layer 130 and between the core metal film 122-1 and the wiring layer 110. The barrier metal film 121-1 contains, for example, titanium, tantalum, or tantalum nitride. The barrier metal film 121-1 has a function of reducing the diffusion of the core metal film 122-1 into the insulating layer 130 and the like.

A film thickness of the barrier metal film 121-1 is the thickest on each of the upper surfaces of the via portion V1 and the bottom portion P1_b_. The film thickness of the barrier metal film 121-1 on each of the side surfaces of the via portion V1, the bottom portion P1_b_, and the interface portion P1_a_ is equal to or more than 0.1 times and less than 0.5 times the film thickness of the barrier metal film 121-1 on each of the upper surfaces of the via portion V1 and the bottom portion P1_b_. Within the above-described range of the film thickness, the film thickness of the barrier metal film 121-1 on each of the via portion V1, the bottom portion P1_b_, and the interface portion P1_a_ may be changed depending on the distance from the bonding surface, or may be substantially uniform. Hereinafter, the feature of the film thickness applied to the barrier metal film 121-1 is also referred to as a "film thickness pattern A".

The core metal film 122-1 is a conductive film filling the inside of the barrier metal film 121-1. The core metal film 122-1 contains, for example, copper. The (111) orientation ratio of copper in the portion belonging to the interface portion P1_a_ of the core metal film 122-1 is higher than the (111) orientation ratio of copper in the portion belonging to the via portion V1 and the bottom portion P1_b_ of the core metal film 122-1. Here, the (111) orientation ratio of copper is a ratio of the diffraction intensity of the (111) orientation surface to the diffraction intensity of the orientation surface other than the (111) orientation surface of copper (for example, the (100) orientation surface). The diffraction intensity is the intensity of a diffraction peak on a predetermined orientation surface. The diffraction intensity is obtained using, for example, a method such as X-ray diffraction (XRD) or electron back scattered diffraction (ESBD).

Next, a configuration on the circuit chip 200 side will be described.

The wiring layer 210 includes, for example, copper or tungsten as a conductive material. The electrode 220 is provided on the upper surface of the wiring layer 210.

The electrode 220 is used as a bonding pad BP on the circuit chip 200 side. The electrode 220 extends in the Z direction. The electrode 220 is classified into a via portion V2 and a pad portion P2. The pad portion P2 is further classified into an interface portion P2*a* and a bottom portion P2*b*. The interface portion P2*a* has a bonding surface. The bottom portion P2*b* is located on a side opposite to the bonding surface with respect to the interface portion P2*a*, and connects the interface portion P2*a* and the via portion V2. The via portion V2 is located on the side opposite to the bonding surface with respect to the bottom portion P2*b*. The lower surface of the bottom portion P2*b* and the lower surface of the via portion V2 are spaced apart from the upper surface (that is, the bonding surface) of the interface portion P2*a*. The side surface of the interface portion P2*a* substantially coincides with an extension of the side surface of the bottom portion P2*b*. The side surface of the via portion V2 does not coincide with the extension of the side surface of the pad portion P2. The upper surface of the interface portion P2*a* is in contact with the electrode 120. The lower surface of the via portion V2 is in contact with the wiring layer 210. The side surface of the via portion V2, the lower surface and the side surface of the bottom portion P2*b*, and the side surface of the interface portion P2*a* are in contact with the insulating layer 230.

The lower surface of the via portion V2 is smaller than the boundary between the bottom portion P2*b* and the via portion V2 when the lower surface is viewed in the Z direction. The lower surface of the bottom portion P2*b* including the boundary between the bottom portion P2*b* and the via portion V2 is smaller than the upper surface of the interface portion P2*a* when the boundary is viewed in the Z direction. That is, the side surface of the pad portion P2 and the side surface of the via portion V2 have a tapered shape.

In addition, the electrode 220 includes a barrier metal film 221-1 and a core metal film 222-1.

The barrier metal film 221-1 is a single-layer conductive film covering the entire surface of the core metal film 222-1 except for the bonding surface. The upper end of the barrier metal film 221-1 reaches the bonding surface. The barrier metal film 221-1 is provided between the core metal film 222-1 and the insulating layer 230 and between the core metal film 222-1 and the wiring layer 210. The barrier metal film 221-1 contains, for example, titanium, tantalum, or tantalum nitride. The barrier metal film 221-1 has a function of reducing the diffusion of the core metal film 222-1 into the insulating layer 230 and the like.

The barrier metal film 221-1 has a film thickness pattern A. That is, the film thickness of the barrier metal film 221-1 is the thickest on the lower surface of each of the via portion V2 and the bottom portion P2*b*. The film thickness of the barrier metal film 221-1 on each of the side surfaces of the via portion V2, the bottom portion P2*b*, and the interface portion P2*a* is in a range of equal to or more than 0.1 times and less than 0.5 times the film thickness of the barrier metal film 221-1 on each of the lower surfaces of the via portion V2 and the bottom portion P2*b*. Within the above-described range of the film thickness, the film thickness of the barrier metal film 221-1 on each of the via portion V2, the bottom portion P2*b*, and the interface portion P2*a* may be changed depending on the distance from the bonding surface, or may be substantially uniform.

The core metal film 222-1 is a conductive film filling the inside of the barrier metal film 221-1. The core metal film 222-1 contains, for example, copper. The (111) orientation ratio of copper in the portion belonging to the interface portion P2*a* of the core metal film 222-1 is higher than the (111) orientation ratio of copper in the portion belonging to the via portion V2 and the bottom portion P2*b* of the core metal film 222-1.

As described above, the configurations of the electrodes 120 and 220 may be made symmetrical with respect to the bonding surfaces.

The (111) orientation ratio of copper contained in the above-described core metal films 122-1 and 222-1 affects the thermal expansion characteristics and mutual diffusion characteristics of the copper contained in the core metal films 122-1 and 222-1.

Specifically, the copper having the (111) orientation has a lower coefficient of thermal expansion than the copper having the (100) orientation. In other words, the copper having a low (111) orientation ratio has a higher coefficient of thermal expansion than the copper having a high (111) orientation ratio. Therefore, the portion belonging to the via portion V1 and the bottom portion P1*b* of the core metal film 122-1 has a higher coefficient of thermal expansion than the portion belonging to the interface portion P1*a* of the core metal film 122-1. Similarly, the portion belonging to the via portion V2 and the bottom portion P2*b* of the core metal film 222-1 has a higher coefficient of thermal expansion than the portion belonging to the interface portion P2*a* of the core metal film 222-1.

In addition, the copper having the (111) orientation has a higher mutual diffusion rate than the copper having the (100) orientation. In other words, the copper having a high (111) orientation ratio has a higher mutual diffusion rate than the copper having a low (111) orientation ratio. Therefore, the portion belonging to the interface portion P1*a* of the core metal film 122-1 has a higher mutual diffusion rate than the portion belonging to the via portion V1 and the bottom portion P1*b* of the core metal film 122-1. Similarly, the portion belonging to the interface portion P2*a* of the core metal film 222-1 has a higher mutual diffusion rate than the portion belonging to the via portion V2 and the bottom portion P2*b* of the core metal film 222-1.

In the example of FIG. 4, the area of the electrode 120 and the area of the electrode 220 on the bonding surface are substantially equal to each other. In such a case, the copper contained in the core metal film 122-1 and the copper contained in the core metal film 222-1 are integrated with each other, and it may be difficult to check the boundary of the copper. It is noted that it is possible to check the bonding through the distortion of the shape in which the electrode 120 and the electrode 220 are bonded due to the positional deviation of the bonding, and the positional deviation (generation of a discontinuous portion on the side surface) between the barrier metal film 121-1 and the barrier metal film 221-1.

In addition, as described above, the side surface of the pad portion P1 and the side surface of the pad portion P2 have a tapered shape. Therefore, the shape of the cross section in the Z direction of the portion where the electrode 120 and the electrode 220 are bonded becomes non-rectangular.

In addition, when the electrode 120 and the electrode 220 are viewed as an integrated electrode layer, the integrated electrode layer has a structure in which the entire surface of copper used for the core metal films 122-1 and 222-1 is covered with the barrier metal films 121-1 and 221-1. On the other hand, in a general wiring layer using copper, an insulating layer (silicon nitride, silicon carbide containing nitrogen, or the like) having a function of preventing oxidation of copper is provided on the upper surface of copper, and the barrier metal film is not provided. Therefore, it is possible to distinguish the integrated electrode layer from a general wiring layer even when there is no misalignment in bonding.

1.2 Manufacturing Method

Figure 7:
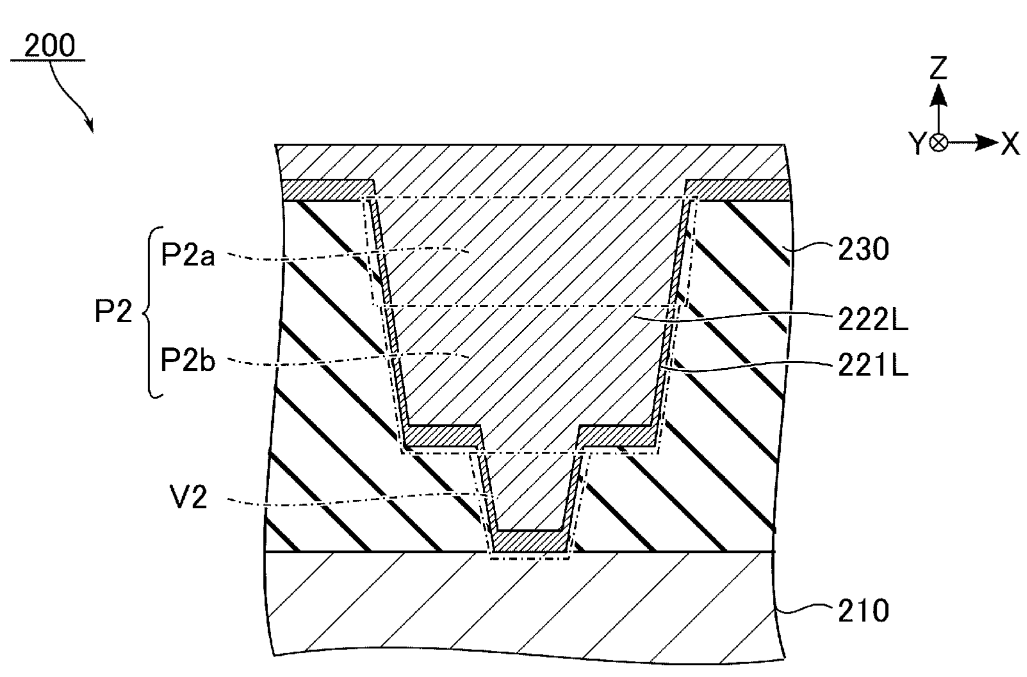
Figure 8:
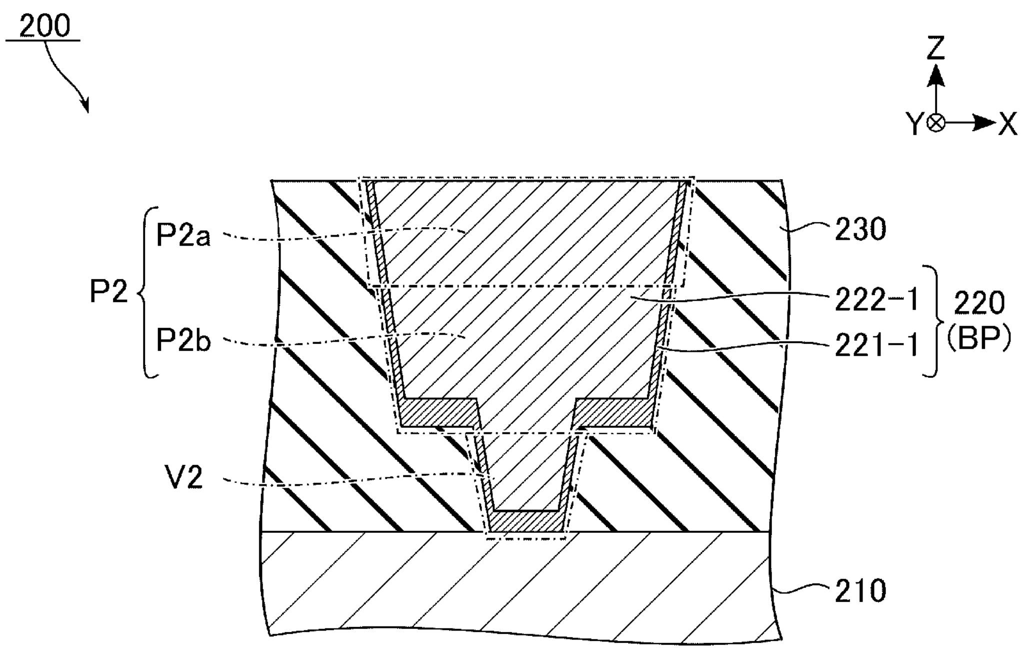
Figure 9:
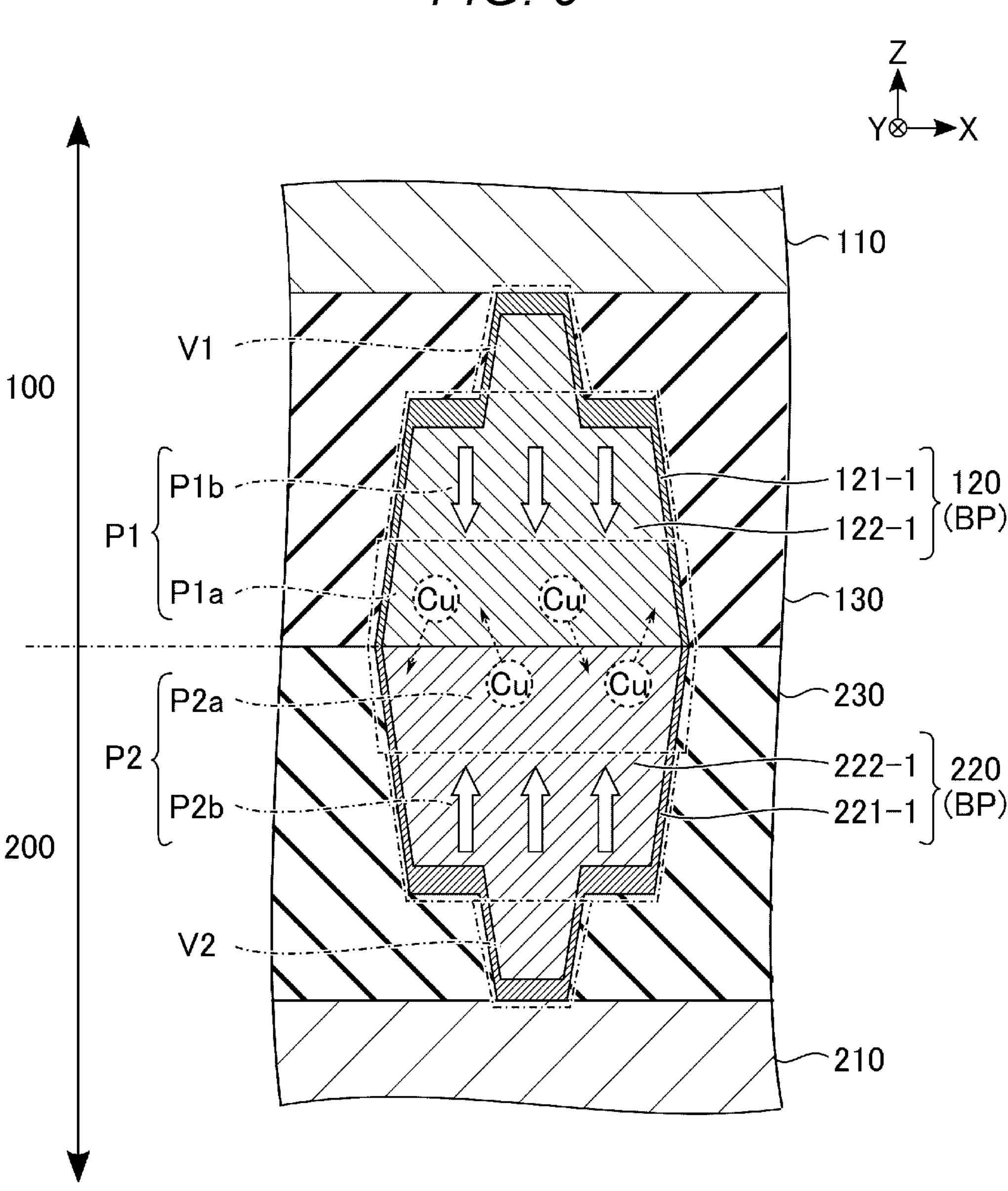
FIG. 9 is a cross-sectional diagram showing an example of a cross-sectional structure of the bonding pad region after the circuit chip and the memory chip are bonded during manufacturing of the memory device according to the first embodiment.

FIGS. 5 to 9 are cross-sectional diagrams showing an example of a cross-sectional structure during manufacturing of the memory device according to the first embodiment. In FIGS. 5 to 8, a part of a cross-sectional structure of the bonding pad BP on the circuit chip 200 side of the memory device 3 during manufacturing is shown. FIG. 9 shows a part of a cross-sectional structure when the memory chip 100 and the circuit chip 200 are bonded.

First, a circuit (not shown) corresponding to the command register 11, the address register 12, the sequencer 13, the driver module 14, the row decoder module 15, and the sense amplifier module 16 is formed on the upper part of the semiconductor substrate (not shown). A wiring layer 210 is provided above the circuit. The wiring layer 210 is electrically connected to the above-described circuit, for example, through a conductor (not shown) extending in the Z direction.

Figure 5:
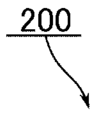
FIGS. 5-8 are cross-sectional diagrams showing an example of a cross-section of the bonding pad region on the circuit chip side during manufacturing of the memory device according to the first embodiment.
Figure 5:
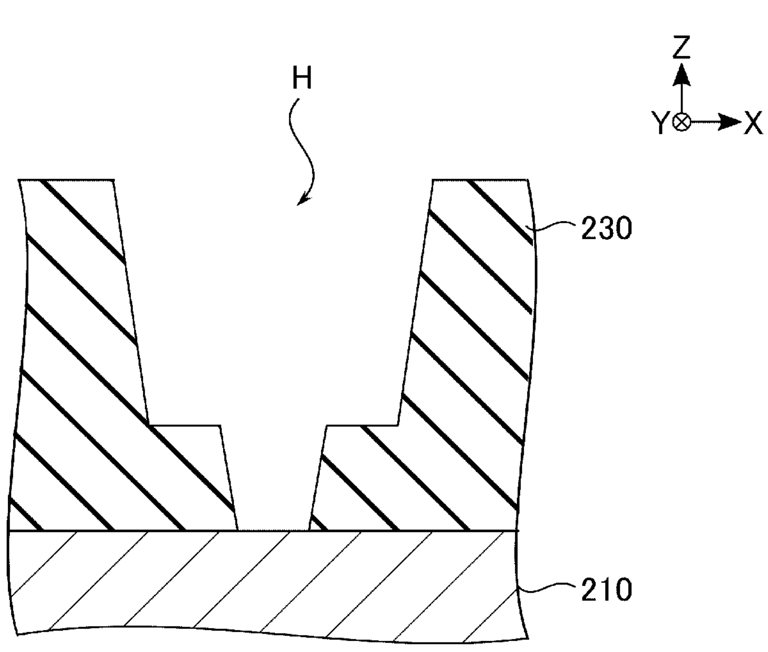

Next, the insulating layer 230 shown in FIG. 5 is provided on the upper surface of the wiring layer 210. Then, in the insulating layer 230, for example, the holes H corresponding to the electrodes 220 are formed by using a dual damascene method. That is, the shape of the hole H corresponds to the shapes of the pad portion P2 and the via portion V2. The wiring layer 210 is exposed on a surface of the hole H corresponding to the lower surface of the via portion V2.

Figure 6:
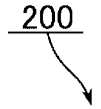
Figure 6:
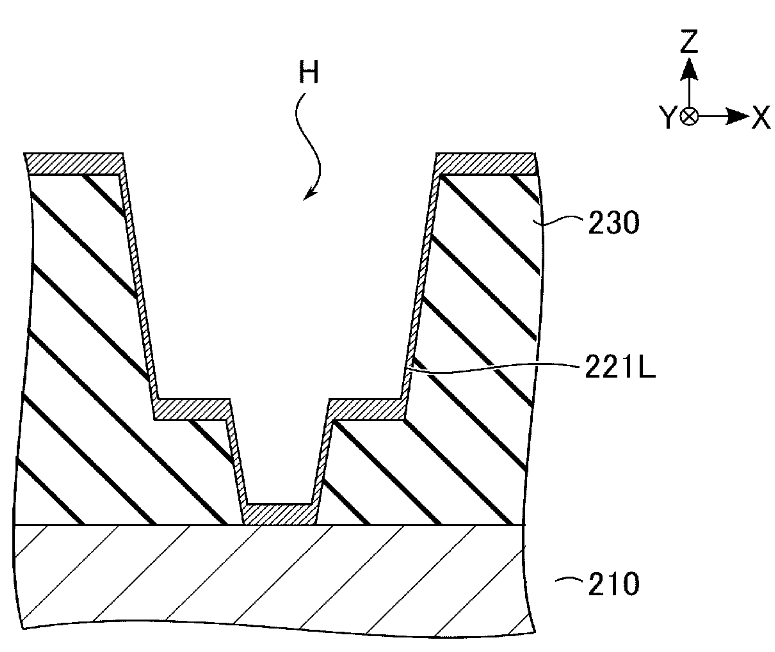

Next, as shown in FIG. 6, the barrier metal film 221L is provided over the entire surface. In the formation of the barrier metal film 221L, the film forming step and the anisotropic etching step are repeatedly performed. Then, the film thickness of the barrier metal film 221L in the hole H is adjusted by adjusting the conditions of each of the film forming step and the anisotropic etching step that are repeatedly performed. Accordingly, the film thickness of the barrier metal film 221L provided on the surface corresponding to the lower surface of each of the via portion V2 and the bottom portion P2*b* becomes the largest among the film thicknesses of the barrier metal film 221L provided in the hole H. In addition, the film thickness of the barrier metal film 221L provided on the surface corresponding to each of the side surfaces of the via portion V2, the bottom portion P2*b*, and the interface portion P2*a* is in a range of equal to or more than 0.1 times and less than 0.5 times the film thickness of the barrier metal film 221L provided on the surface corresponding to each of the lower surfaces of the via portion V2 and the bottom portion P2*b*.

Next, as shown in FIG. 7, the core metal film 222L is provided over the entire surface such that the hole H is filled, and then a heat treatment is performed. At the time of forming the core metal film 222L, the (111) orientation ratio of copper contained in the core metal film 222L changes according to the film thickness of the barrier metal film 221L at the position which is the origin of the film formation of copper. Specifically, the (111) orientation ratio of copper film-formed on the barrier metal film 221L having a relatively thick film thickness as a base point is lower than the (111) orientation ratio of copper film-formed on the barrier metal film 221L having a relatively thin film thickness as a base point.

Here, the portion belonging to the via portion V2 and the bottom portion P2*b* of the core metal film 222L is located close to the lower surface of the via portion V2 and the lower surface of the bottom portion P2*b* having a relatively thick film thickness of the barrier metal film 221L. Therefore, the (111) orientation ratio of copper contained in the portion belonging to the via portion V2 and the bottom portion P2*b* of the core metal film 222L becomes relatively low. On the other hand, a portion belonging to the interface portion P2*a* of the core metal film 222L is located at a position far from the lower surface of the via portion V2 and the lower surface of the bottom portion P2*b* having a relatively thick film thickness of the barrier metal film 221L. Therefore, the (111) orientation ratio of copper contained in the portion belonging to the interface portion P2*a* of the core metal film 222L becomes relatively high.

Next, as shown in FIG. 8, a portion above the insulating layer 230 is removed by chemical mechanical polishing (CMP). As a result, the barrier metal film 221L and the core metal film 222L remain in each hole H, so that the circuit chip 200 is formed.

In addition, although not shown, the memory chip 100 is formed in parallel with the formation of the circuit chip 200. The method of manufacturing the bonding pad BP on the memory chip 100 side is the same as the method of manufacturing the bonding pad BP on the circuit chip 200 side.

Next, as shown in FIG. 9, the memory chip 100 and the circuit chip 200 are bonded such that the electrode 120 and the electrode 220 are brought in contact with each other. In the bonding step, a heat treatment is performed in a state where the electrode 120 and the electrode 220 are in contact with each other.

As described above, the copper contained in each of the portion belonging to the via portion V1 and the bottom portion P1*b* of the core metal film 122-1, and the portion belonging to the via portion V2 and the bottom portion P2*b* of the core metal film 222-1 has a relatively high coefficient of thermal expansion. As a result, the copper contained in each of the portion belonging to the via portion V1 and the bottom portion P1*b* of the core metal film 122-1, and the portion belonging to the via portion V2 and the bottom portion P2*b* of the core metal film 222-1 expands more than the other portions of the core metal film 122-1 and 222-1 in the direction of filling the gap between the electrodes 120 and 220. In addition, as described above, the copper contained in the portion belonging to the interface portion P1*a* of the core metal film 122-1 and the portion belonging to the interface portion P2*a* of the core metal film 222-1 has a relatively high mutual diffusion rate. As a result, the copper contained in each of the portion belonging to the interface portion P1*a* of the core metal film 122-1 and the portion belonging to the interface portion P2*a* of the core metal film 222-1 are more likely to diffuse into each other (relative to the other portions of the core metal film 122-1 and 222-1) through the portion in contact with each other between the electrodes 120 and 220, so that any gap between the electrodes 120 and 220 is more easily filled.

As described above, the memory device 3 is formed.

1.3 Effects Related to First Embodiment

According to the first embodiment, it is possible to improve the yield of the memory device 3. The effect will be described below.

The film thickness of the barrier metal film 121-1 covering the upper surface of the core metal film 122-1 is greater than the film thickness of the barrier metal film 121-1 covering the side surface of the core metal film 122-1. As a result, the (111) orientation ratio of copper contained in the portion belonging to the interface portion P1*a* of the core metal film 122-1 can be made higher than the (111) orientation ratio of copper contained in the portion belonging to the bottom portion P1*b* and the via portion V1 of the core metal film 122-1. Therefore, it is possible to increase the coefficient of thermal expansion of copper contained in the portion belonging to the bottom portion P1*b* and the via portion V1 of the core metal film 122-1 while increasing diffusion rate of copper provided in the portion belonging to the interface portion P1*a* of the core metal film 122-1.

Similarly, the film thickness of the barrier metal film 221-1 covering the lower surface of the core metal film 222-1 is greater than the film thickness of the barrier metal film 221-1 covering the side surface of the core metal film 222-1. As a result, the (111) orientation ratio of copper contained in the portion belonging to the interface portion P2*a* of the core metal film 222-1 can be made higher than the (111) orientation ratio of copper contained in the portion belonging to the bottom portion P2*b* and the via portion V2 of the core metal film 222-1. Therefore, it is possible to increase the coefficient of thermal expansion of copper contained in the portion belonging to the bottom portion P2*b* and the via portion V2 of the core metal film 222-1 while increasing diffusion rate of copper which is provided in the portion belonging to the interface portion P2*a* of the core metal film 222-1.

By providing the above-described configuration, at the time of bonding between the bonding pads BP, the bottom portions P1*b* and P2*b* and the via portions V1 and V2 contribute to the bonding by greater thermal expansion, and the interface portions P1*a* and Pa contribute to the bonding by greater mutual diffusion. Therefore, the occurrence of a gap between the core metal films 122-1 and 222-1 can be reduced, so that the occurrence of an open failure during energization can be reduced.

1.4 Modification Example of First Embodiment

In the above-described first embodiment, a case where the film thickness of the barrier metal film on the side surface of the interface portion and the film thickness of the barrier metal film on the side surface of the bottom portion are the same thicknesses has been described, but the present disclosure is not limited thereto. For example, the film thickness of the barrier metal film may be gradually reduced from the bottom portion toward the interface portion. Hereinafter, a configuration and a manufacturing method different from those of the first embodiment will be mainly described. As for the configuration and the manufacturing method equivalent to the first embodiment, the description is appropriately omitted.

Figure 10:
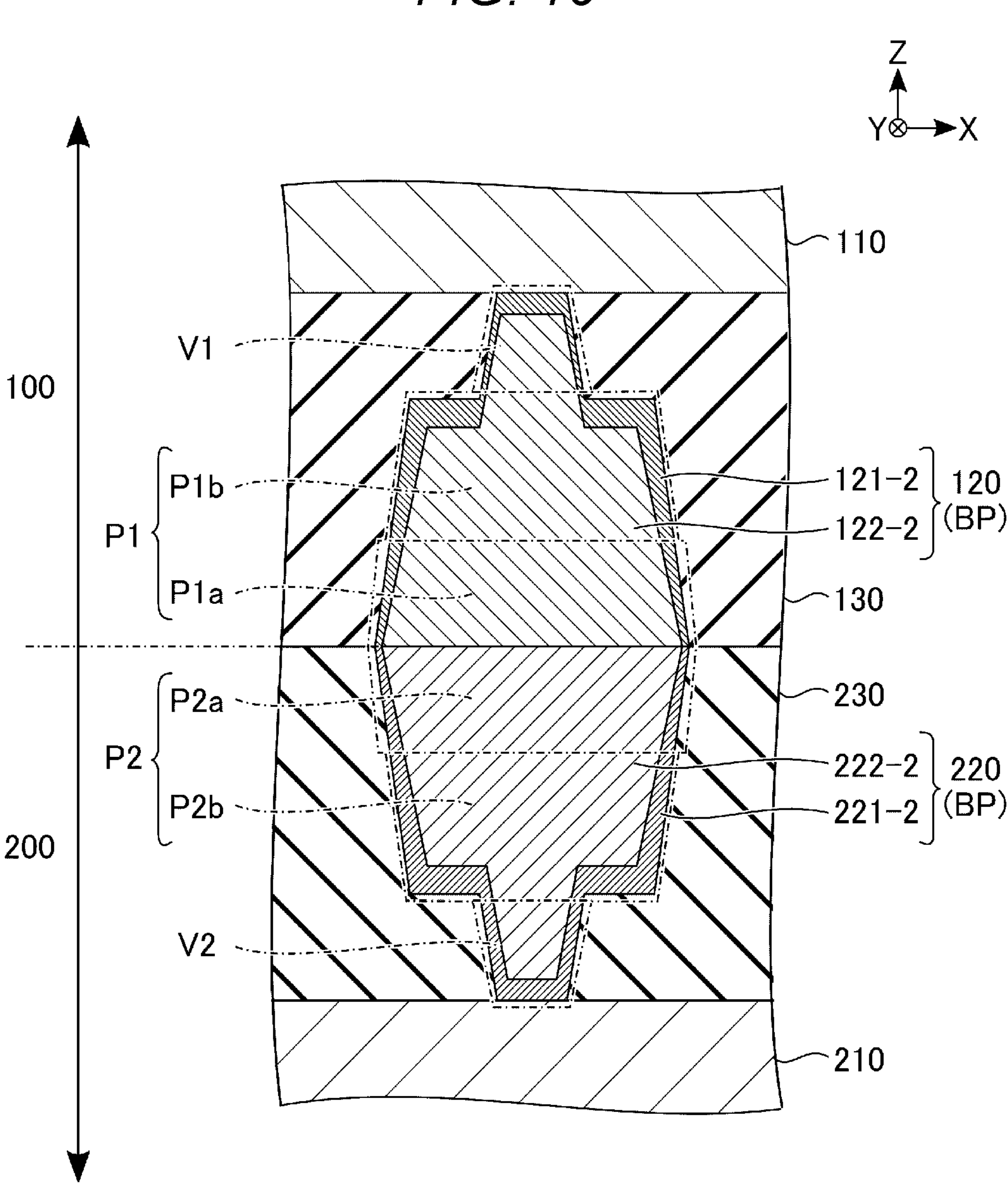
FIG. 10 is a cross-sectional view showing a modification example of a cross-sectional structure of a bonding pad of the memory device according to the first embodiment.

FIG. 10 is a cross-sectional view showing an example of a cross-sectional structure of the bonding pad of the memory device according to the modification example of the first embodiment. FIG. 10 corresponds to FIG. 4 in the first embodiment.

As shown in FIG. 10, the electrode 120 includes a barrier metal film 121-2 and a core metal film 122-2. The electrode 220 includes a barrier metal film 221-2 and a core metal film 222-2. The overall shape of the electrodes 120 and 220 is the same as the overall shape of the electrodes 120 and 220 in the first embodiment. The configurations of the core metal films 122-2 and 222-2 are the same as the configurations of the core metal films 122-1 and 222-1 in the first embodiment. In addition, the electrodes 120 and 220 may have a configuration that is symmetrical with respect to the bonding surfaces. Therefore, hereinafter, the configuration of the electrode 220 will be mainly described.

The barrier metal film 221-2 is a single-layer conductive film covering the entire surface of the core metal film 222-2 except for the bonding surface. The upper end of the barrier metal film 221-2 reaches the bonding surface. The barrier metal film 221-2 is provided between the core metal film 222-2 and the insulating layer 230 and between the core metal film 222-2 and the wiring layer 210. The barrier metal film 221-2 contains, for example, titanium, tantalum, or tantalum nitride. The barrier metal film 221-2 has a function of reducing the diffusion of the core metal film 222-2 into the insulating layer 230 and the like.

The film thickness of the barrier metal film 221-2 is the thickest on the lower surface of each of the via portion V2 and the bottom portion P2*b*. The film thickness of the barrier metal film 221-2 on each of the side surfaces of the via portion V2 and the bottom portion P2*b* is in a range of equal to or more than 0.3 times and less than 1.0 times the film thickness of the barrier metal film 221-2 on the lower surface of each of the via portion V2 and the bottom portion P2*b*. The film thickness of the barrier metal film 221-2 on the side surface of the interface portion P2*a* is thinner than the film thickness of the barrier metal film 221-2 on each of the side surfaces of the via portion V2 and the bottom portion P2*b*, and is in a range of equal to or more than 0.1 times and less than 0.5 times the film thickness of the barrier metal film 221-2 on each of the lower surfaces of the via portion V2 and the bottom portion P2*b*. Hereinafter, the feature of the film thickness applied to the barrier metal film 221-2 is also referred to as a "film thickness pattern B".

With the above-described configuration, the film thickness of the barrier metal film 221-2 on each of the bottom portion P2*b* and the via portion V2 can be made thicker than the film thickness of the barrier metal film 221-2 at the interface portion P2*a*. As a result, the (111) orientation ratio of copper in the portion belonging to the bottom portion P2*b* and the via portion V2 of the core metal film 222-2 can be made lower than the (111) orientation ratio of copper in the portion belonging to the interface portion P2*a* of the core metal film 222-2. Therefore, in the bonding step, the amount of expansion of copper in the portion belonging to the bottom portion P2*b* and the via portion V2 of the core metal film 222-2 can be increased. Therefore, it is possible to reduce poor bonding between the electrodes 120 and 220.

2. SECOND EMBODIMENT

Next, a memory device according to a second embodiment will be described. The second embodiment is different from the first embodiment in that the bonding pad BP includes a barrier metal film of a plurality of film types. The following description mainly describes the configuration and the manufacturing method different from the first embodiment. As for the configuration and the manufacturing method equivalent to the first embodiment, the description is appropriately omitted.

The bonding pad BP in the second embodiment may have a configuration symmetrical with respect to the bonding surface, as in the bonding pad BP in the first embodiment.

Therefore, in the following, the configuration of the bonding pad BP on the circuit chip 200 side will be mainly described.

2.1 Cross-Sectional Structure of Bonding Pad

Figure 11:
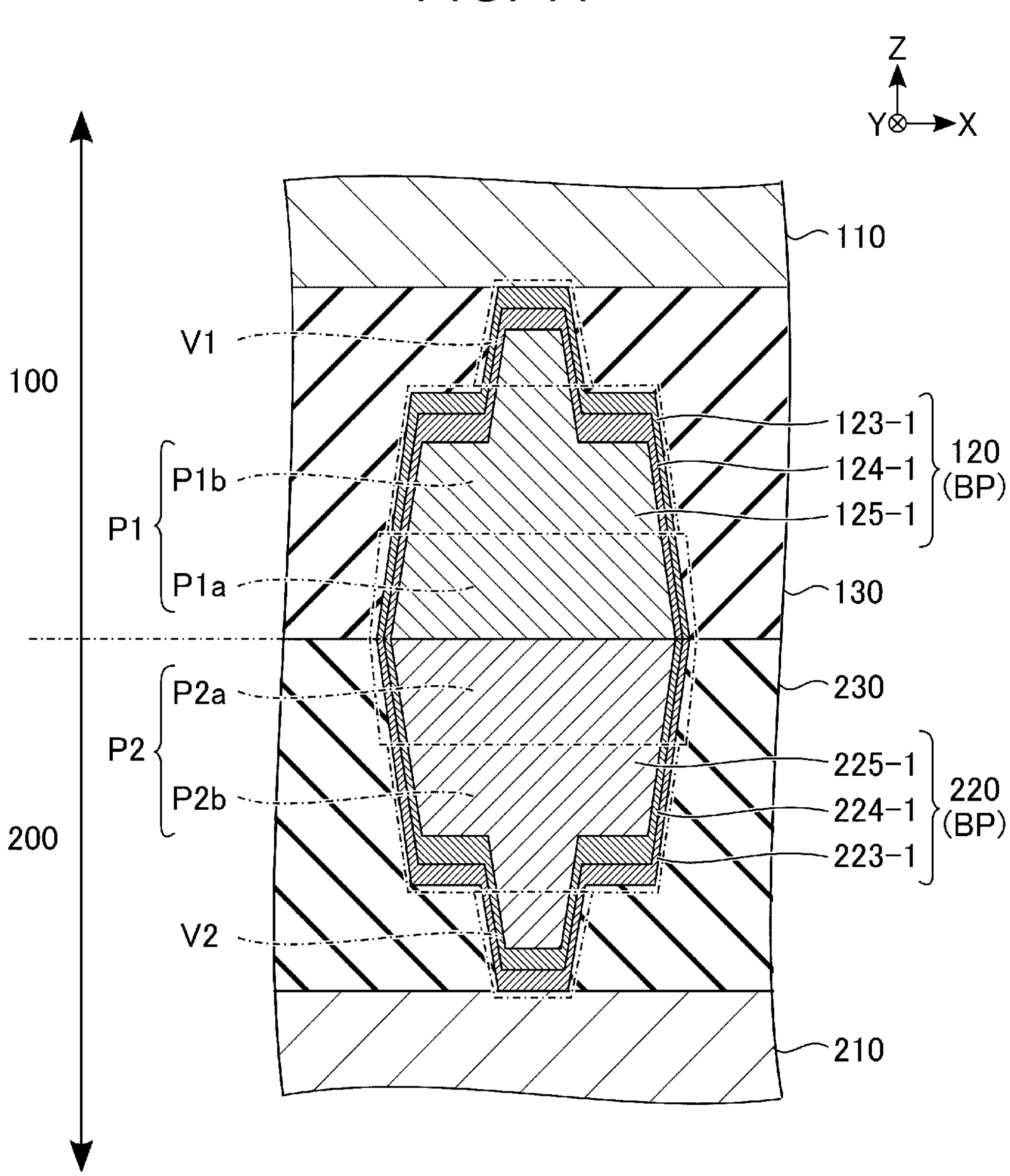
FIG. 11 is a cross-sectional view showing a first example of a cross-sectional structure of a bonding pad of the memory device according to a second embodiment.
Figure 12:
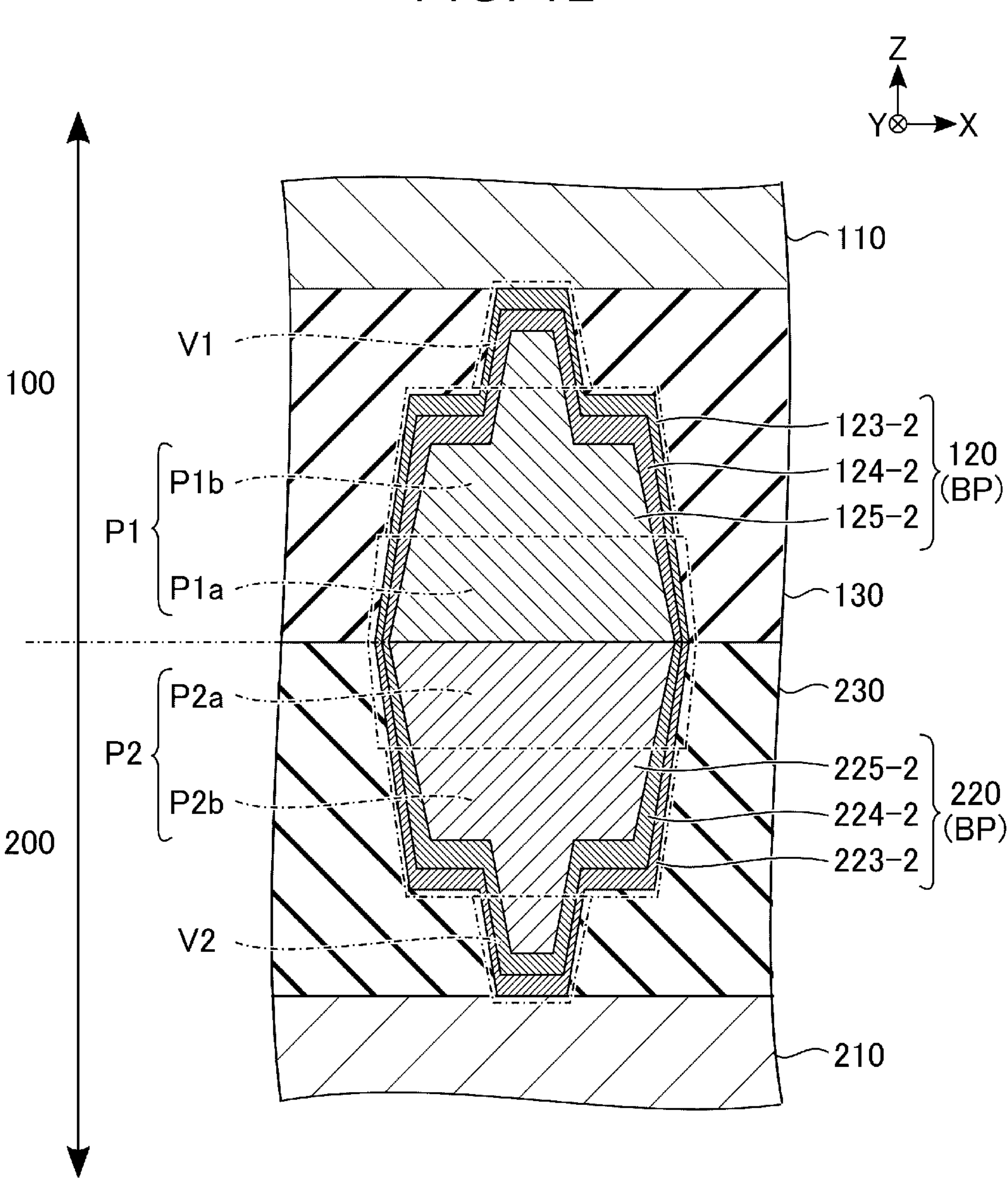
FIG. 12 is a cross-sectional view showing a second example of a cross-sectional structure of a bonding pad of the memory device according to a second embodiment.
Figure 13:
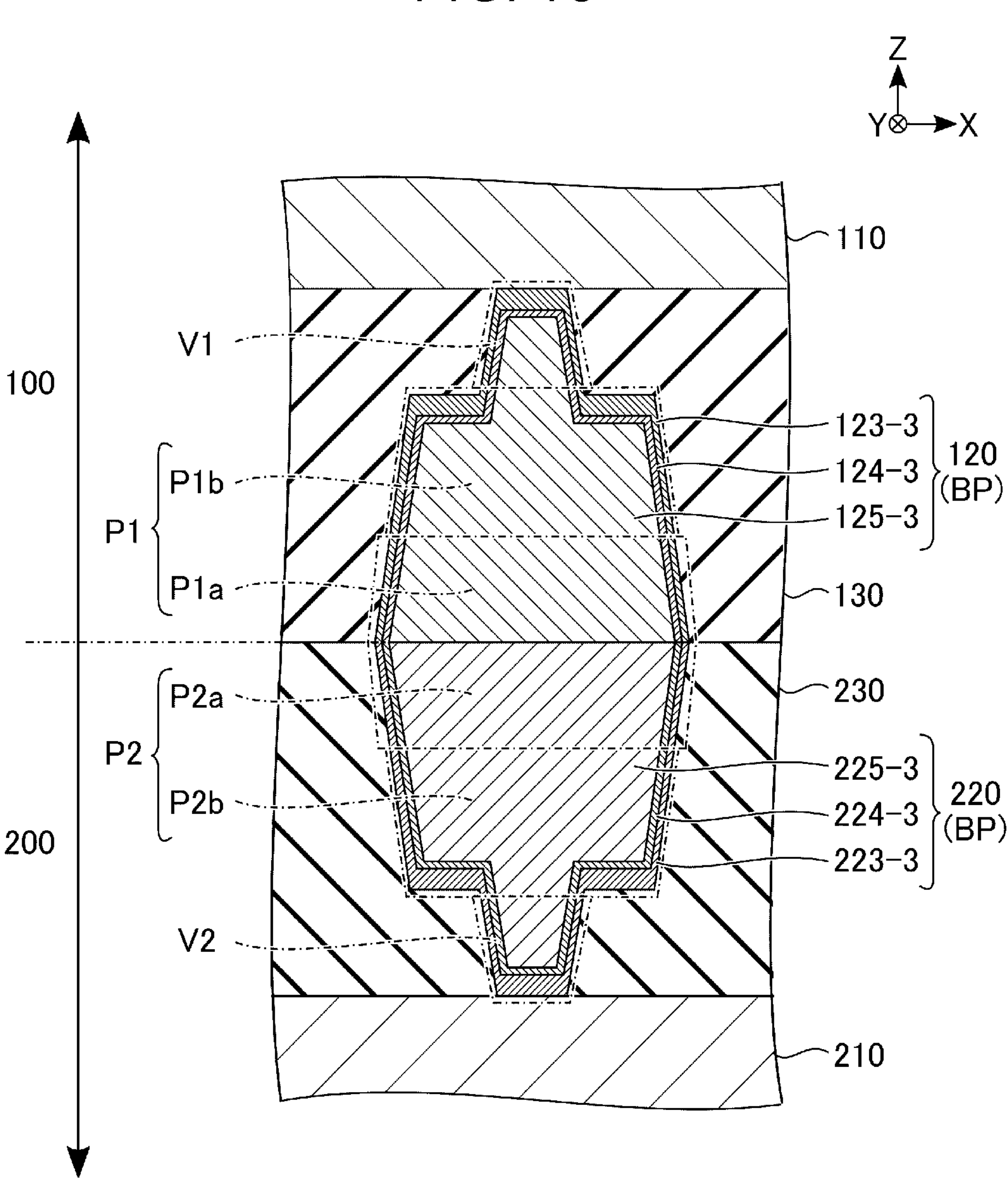
FIG. 13 is a cross-sectional view showing a third example of a cross-sectional structure of a bonding pad of the memory device according to a second embodiment.
Figure 14:
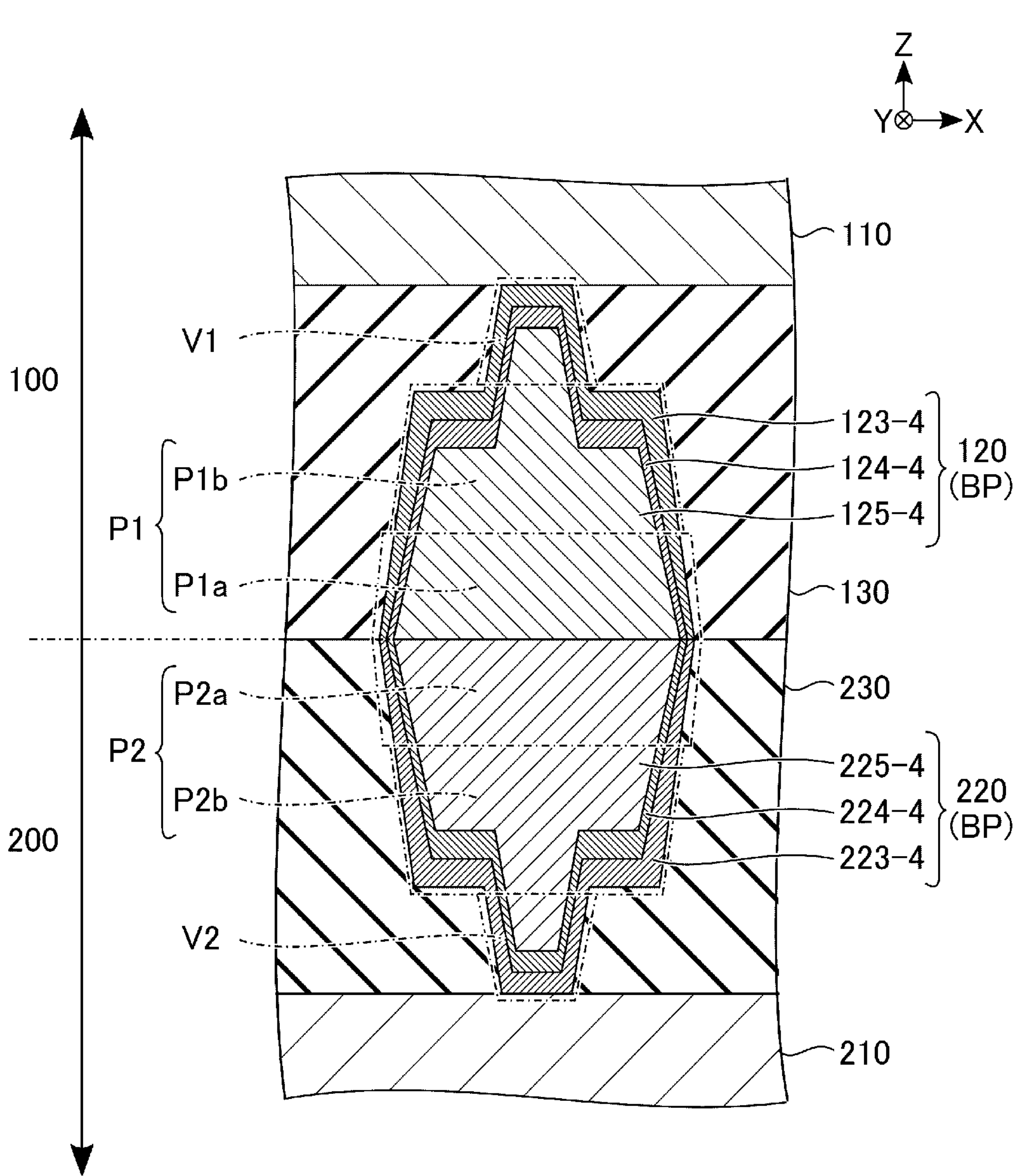
FIG. 14 is a cross-sectional view showing a fourth example of a cross-sectional structure of a bonding pad of the memory device according to a second embodiment.
Figure 15:
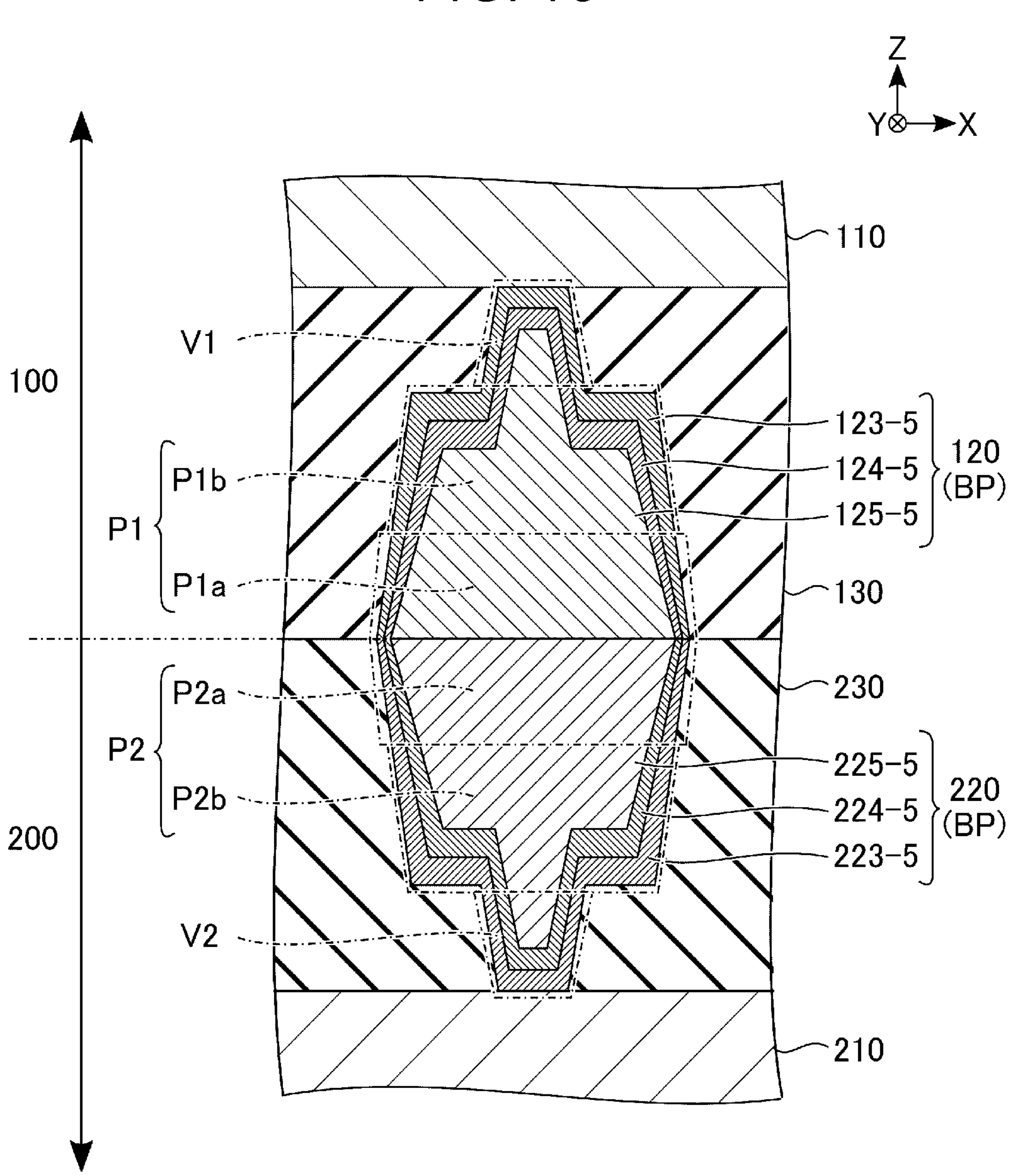
FIG. 15 is a cross-sectional view showing a fifth example of a cross-sectional structure of a bonding pad of the memory device according to a second embodiment.
Figure 16:
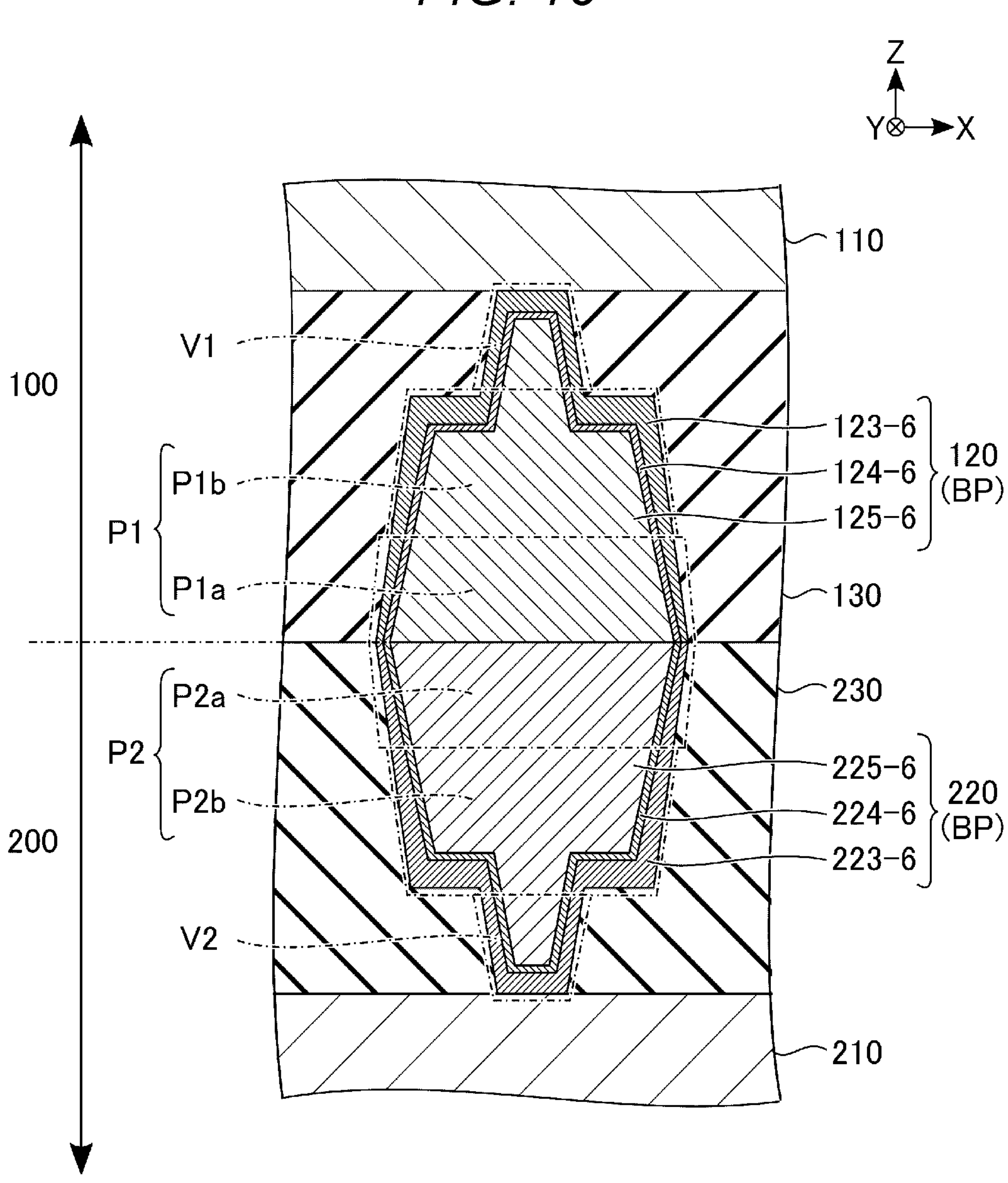
FIG. 16 is a cross-sectional view showing a sixth example of a cross-sectional structure of a bonding pad of the memory device according to a second embodiment.
Figure 17:
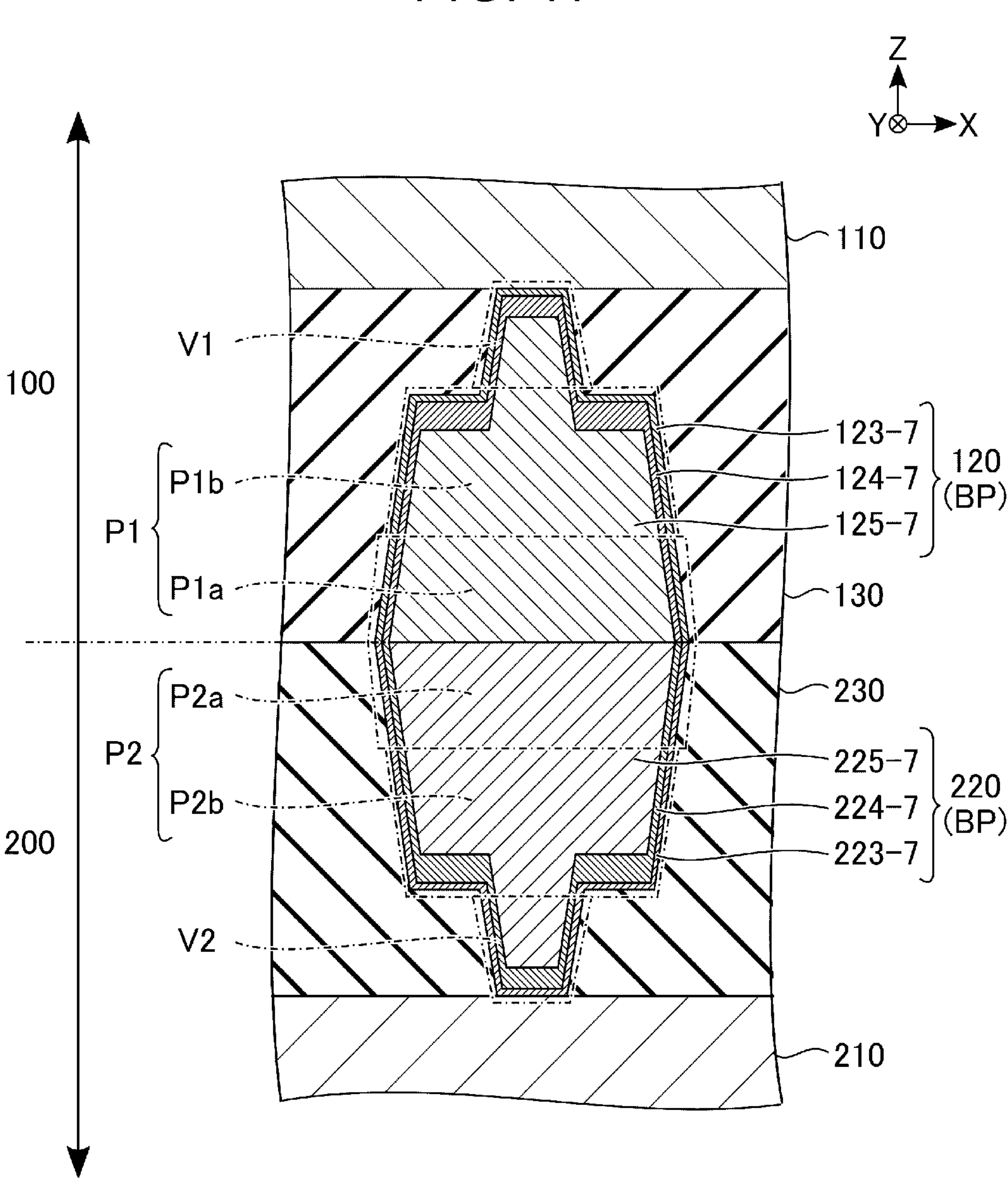
FIG. 17 is a cross-sectional view showing a seventh example of a cross-sectional structure of a bonding pad of the memory device according to a second embodiment.
Figure 18:
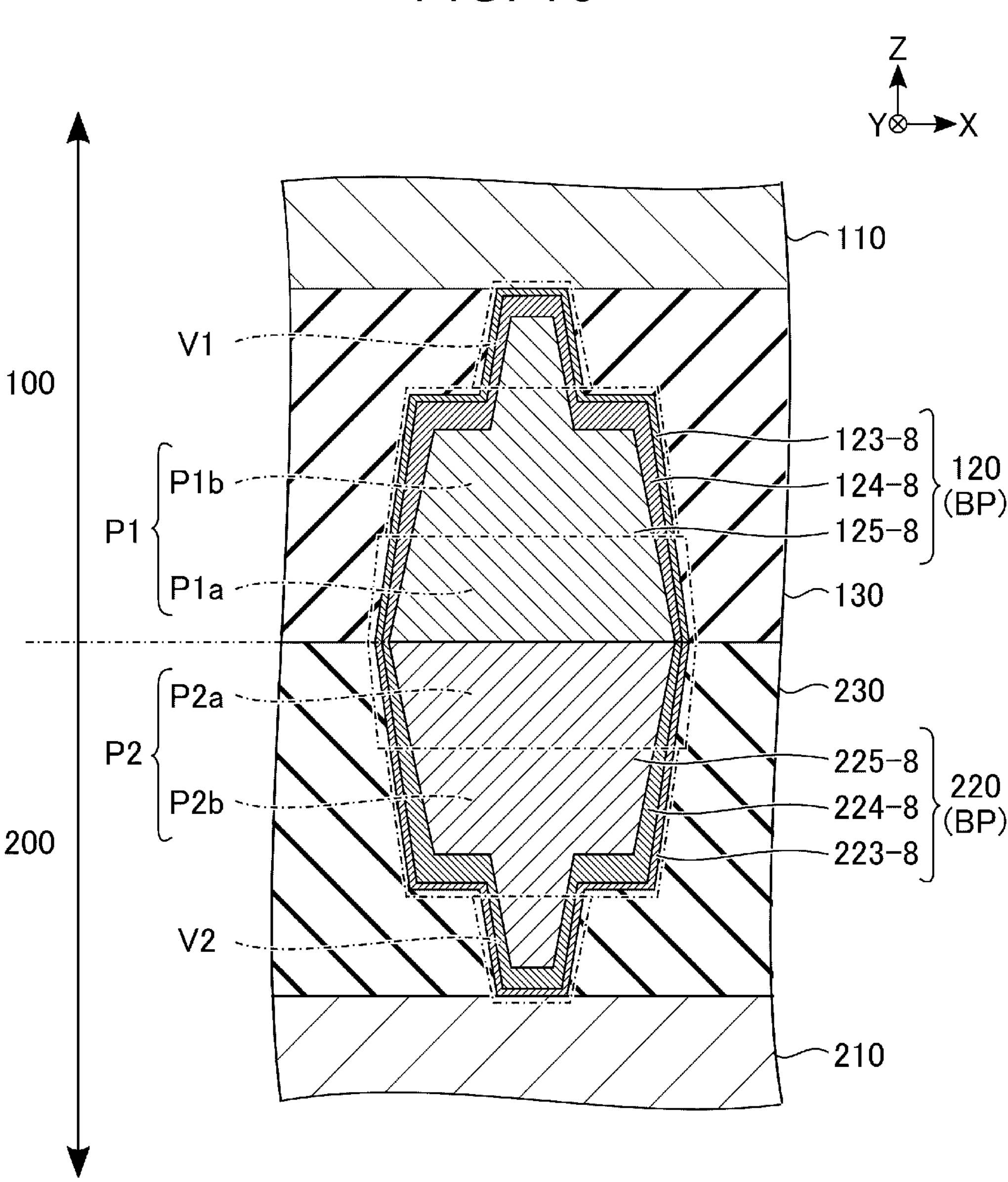
FIG. 18 is a cross-sectional view showing an eighth example of a cross-sectional structure of a bonding pad of the memory device according to a second embodiment.

FIG. 11 is a cross-sectional view showing a first example of a cross-sectional structure of a bonding pad of the memory device according to a second embodiment. FIG. 12 is a cross-sectional view showing a second example of a cross-sectional structure of a bonding pad of the memory device according to a second embodiment. FIG. 13 is a cross-sectional view showing a third example of a cross-sectional structure of a bonding pad of the memory device according to a second embodiment. FIG. 14 is a cross-sectional view showing a fourth example of a cross-sectional structure of a bonding pad of the memory device according to a second embodiment. FIG. 15 is a cross-sectional view showing a fifth example of a cross-sectional structure of a bonding pad of the memory device according to a second embodiment. FIG. 16 is a cross-sectional view showing a sixth example of a cross-sectional structure of a bonding pad of the memory device according to a second embodiment. FIG. 17 is a cross-sectional view showing a seventh example of a cross-sectional structure of a bonding pad of the memory device according to a second embodiment. FIG. 18 is a cross-sectional view showing an eighth example of a cross-sectional structure of a bonding pad of the memory device according to a second embodiment. Each of FIGS. 11 to 18 corresponds to FIG. 4 in the first embodiment.

As shown in FIGS. 11 to 18, the electrode 120 in the x-th example of the second embodiment includes barrier metal films 123-*x* and 124-*x* and a core metal film 125-*x*. The electrode 220 in the x-th example of the second embodiment includes the barrier metal films 223-*x* and 224-*x*, and the core metal film 225-*x* ($1 \leq x \leq 8$).

Hereinafter, matters common to all of the first to eighth examples of the second embodiment will be described by adding "-x" to the elements.

The barrier metal film 223-*x* is a single-layer conductive film covering the side surfaces and the lower surface of the barrier metal film 224-*x*. The upper end of the barrier metal film 223-*x* reaches the bonding surface. The barrier metal film 223-*x* is provided between the barrier metal film 224-*x* and the insulating layer 230 and between the barrier metal film 224-*x* and the wiring layer 210. The barrier metal film 223-*x* contains, for example, titanium, tantalum, or tantalum nitride. The barrier metal film 223-*x* has a function of reducing the diffusion of the core metal film 225-*x* into the insulating layer 230 and the like.

The barrier metal film 224-*x* is a single-layer conductive film covering the inside of the barrier metal film 223-*x*. The upper end of the barrier metal film 224-*x* reaches the bonding surface. The barrier metal film 224-*x* is provided between the barrier metal film 223-*x* and the core metal film 225-*x*. The barrier metal film 224-*x* contains, for example, a film type different from that of the barrier metal film 223-*x* among titanium, tantalum, and tantalum nitride. The barrier metal film 224-*x* has a function of reducing the diffusion of the core metal film 225-*x* into the insulating layer 230 and the like, together with the barrier metal film 223-*x*. That is, the barrier metal films 223-*x* and 224-*x* are conductive films in a stack covering the entire surface excluding the bonding surface of the core metal film 225-*x*.

The core metal film 225-*x* fills the inside of the barrier metal film 224-*x*. The core metal film 225-*x* contains, for example, copper. The (111) orientation ratio of copper in the portion belonging to the interface portion P2*a* of the core metal film 225-*x* is higher than the (111) orientation ratio of copper in the portion belonging to the via portion V2 and the bottom portion P2*b* of the core metal film 225-*x*.

Next, individual matters of the first example of the second embodiment to the eighth example of the second embodiment will be described by assigning any of "-1" to "-8" to the elements.

In the first example of the second embodiment, each of the barrier metal films 223-1 and 224-1 has a film thickness pattern A.

In the second example of the second embodiment, the barrier metal film 223-2 has a film thickness pattern A. The barrier metal film 224-2 has a film thickness pattern B.

In the third example of the second embodiment, the barrier metal film 223-3 has a film thickness pattern A. The film thickness of the barrier metal film 224-3 is substantially uniform over the entire surface (that is, the lower surface of each of the via portion V2 and the bottom portion P2*b*, and the side surface of each of the via portion V2, the bottom portion P2*b*, and the interface portion P2*a*). Hereinafter, the feature of the film thickness applied to the barrier metal film 224-3 is also referred to as a "film thickness pattern C".

In the fourth example of the second embodiment, the barrier metal film 223-4 has a film thickness pattern B. The barrier metal film 224-4 has a film thickness pattern A.

In the fifth example of the second embodiment, each of the barrier metal films 223-5 and 224-5 has a film thickness pattern B.

In the sixth example of the second embodiment, the barrier metal film 223-6 has a film thickness pattern B. The barrier metal film 224-6 has a film thickness pattern C.

In the seventh example of the second embodiment, the barrier metal film 223-7 has a film thickness pattern C. The barrier metal film 224-7 has a film thickness pattern A.

In the eighth example of the second embodiment, the barrier metal film 223-8 has a film thickness pattern C. The barrier metal film 224-8 has a film thickness pattern B.

2.2 Effects of Second Embodiment

According to the second embodiment described above, in any case of the first to eighth examples of the second embodiment, the portion belonging to the via portion V2 and the bottom portion P2*b* of the core metal film 225-*x* is located at a position close to the lower surface of the via portion V2 and the lower surface of the bottom portion P2*b*, where the total film thickness of the stacked barrier metal films 223-*x* and 224-*x* is relatively large. On the other hand, a portion belonging to the interface portion P2*a* of the core metal film 225-*x* is located at a position far from the lower surface of the via portion V2 and the lower surface of the bottom portion P2*b* having a relatively thick film thickness of the stacked barrier metal films 223-*x* and 224-*x*. As a result, the (111) orientation ratio of copper in the portion belonging to the interface portion P2*a* of the core metal film 225-*x* is higher than the (111) orientation ratio of copper in the portion belonging to the via portion V2 and the bottom portion P2*b* of the core metal film 225-*x*. Therefore, in the same manner as in the first embodiment, when the heat treatment is performed in the bonding step, a large amount of copper can be diffused between the core metal films 125-*x* and 225-1 on the bonding surface while the core metal films 125-*x* and 225-*x* are expanded in a direction in which the core metal films 125-*x* and 225-*x* approach each other. Therefore, the occurrence of a gap between the core metal films 125-*x* and 225-*x* can be reduced, and thus, the occurrence of an open failure during energization can be reduced.

3. THIRD EMBODIMENT

Next, a memory device according to a third embodiment will be described. The third embodiment is different from the first embodiment and the second embodiment in that one of the plurality of film types of the barrier metal film provided in the bonding pad BP is cut in the vicinity of the bonding surface. In the following description, a configuration and a manufacturing method different from those of the first embodiment and the second embodiment will be mainly described. The same configurations and manufacturing methods as those of the first embodiment and the second embodiment will not be described in detail.

The bonding pad BP in the third embodiment may have the same configuration as in the bonding pad BP in the first embodiment and the second embodiment symmetrical with respect to the bonding surface. Therefore, in the following, the configuration of the bonding pad BP on the circuit chip 200 side will be mainly described.

3.1 Cross-Sectional Structure of Bonding Pad

First Example to Third Example

Figure 19:
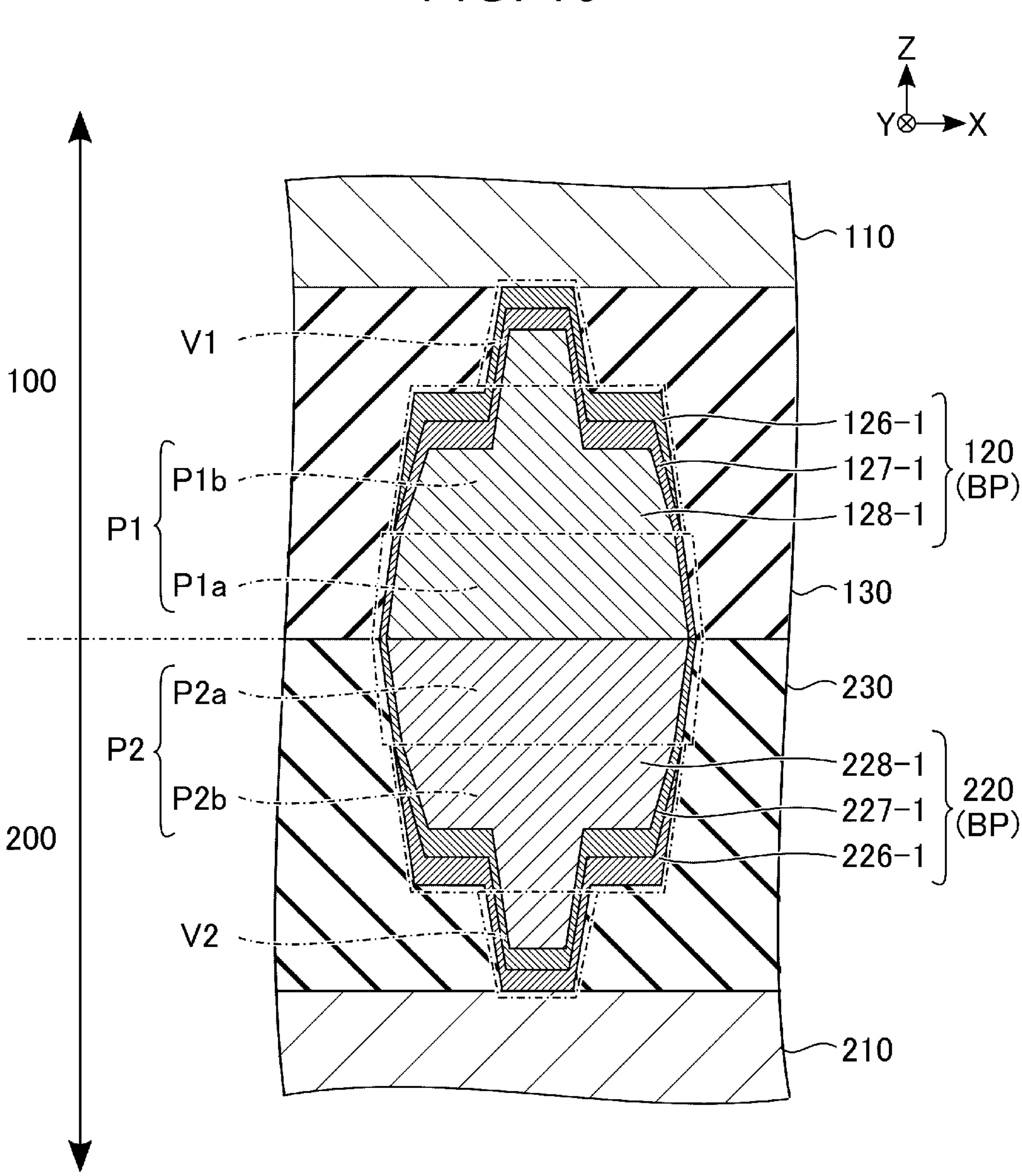
FIG. 19 is a cross-sectional view showing a first example of a cross-sectional structure of a bonding pad of the memory device according to a third embodiment.
Figure 20:
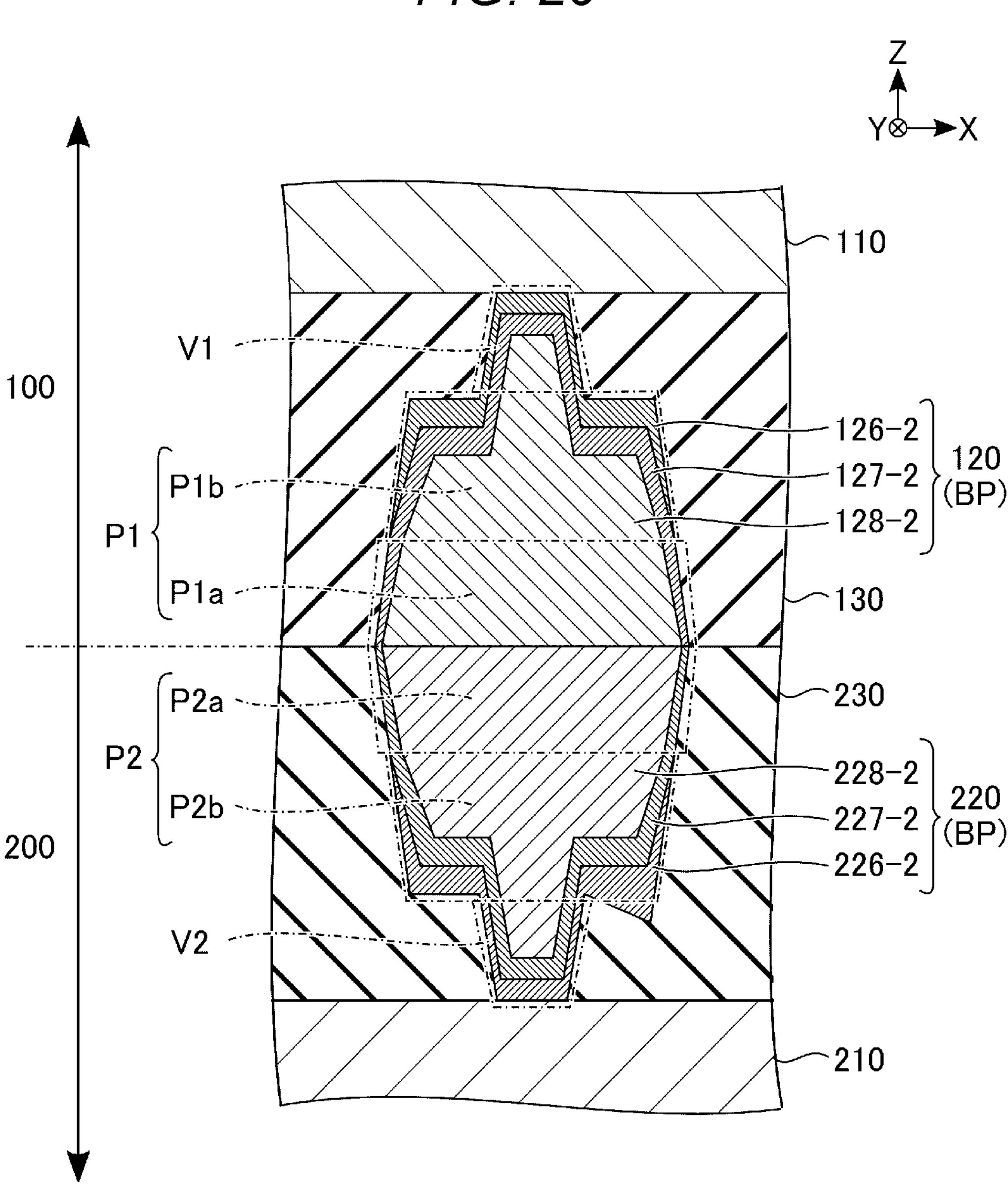
FIG. 20 is a cross-sectional view showing a second example of a cross-sectional structure of a bonding pad of the memory device according to a third embodiment.
Figure 21:
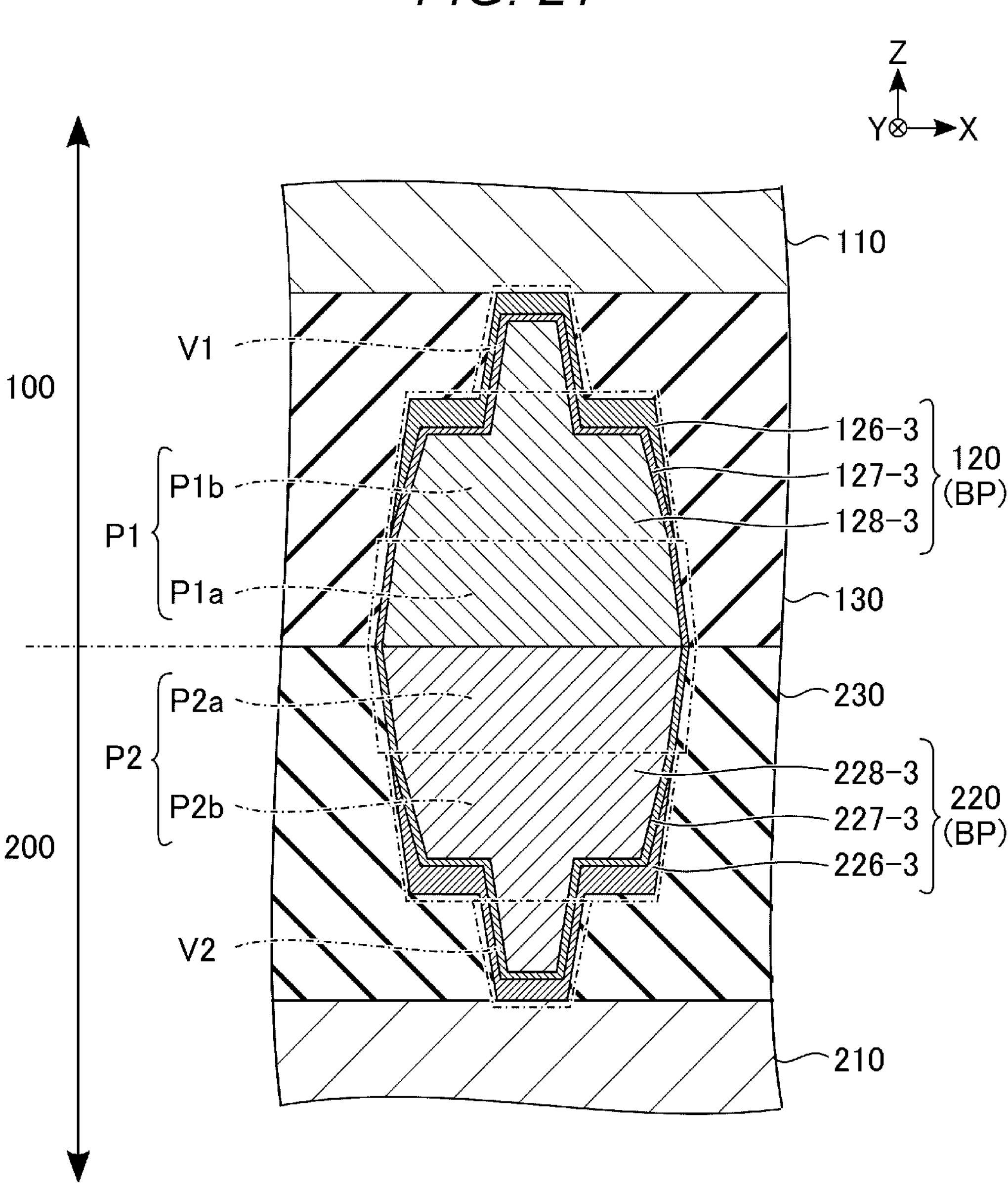
FIG. 21 is a cross-sectional view showing a third example of a cross-sectional structure of a bonding pad of the memory device according to a third embodiment.

FIG. 19 is a cross-sectional view showing a first example of a cross-sectional structure of a bonding pad of the memory device according to a third embodiment. FIG. 20 is a cross-sectional view showing a second example of a cross-sectional structure of a bonding pad of the memory device according to a third embodiment. FIG. 21 is a cross-sectional view showing a third example of a cross-sectional structure of a bonding pad of the memory device according to a third embodiment. Each of FIGS. 19 to 21 corresponds to FIG. 4 in the first embodiment.

As shown in FIGS. 19 to 21, the electrode 120 in the y-th example of the third embodiment includes barrier metal films 126-*y* and 127-*y* and a core metal film 128-*y*. The electrode 220 in the y-th example of the third embodiment includes barrier metal films 226-*y* and 227-*y* and a core metal film 228-*y* ($1 \leq y \leq 3$).

Hereinafter, matters common to the first example of the third embodiment to the third example of the third embodiment will be described by adding "-y" to the elements. Individual matters of the first example of the third embodiment to the third example of the third embodiment will be described by adding any of "-1" to "-3" to the elements.

The barrier metal film 226-*y* is a single-layer conductive film covering the side surfaces and the lower surface of each of the portions belonging to the via portion V2 and the bottom portion P2*b* of the barrier metal film 227-*y*. The barrier metal film 226-*y* is not provided in the interface portion P2*a*. That is, the upper end of the barrier metal film 226-*y* does not reach the bonding surface. The barrier metal film 226-*y* is provided between the portion belonging to the bottom portion P2*b* and the via portion V2 of the barrier metal film 227-*y* and the insulating layer 230, and between the barrier metal film 227-*y* and the wiring layer 210. The barrier metal film 226-*y* contains, for example, titanium, tantalum, or tantalum nitride. The barrier metal film 226-*y* has a function of reducing the diffusion of the core metal film 228-*y* into the insulating layer 230 and the like.

The film thickness of the barrier metal film 226-*y* is the thickest on the lower surface of each of the via portion V2 and the bottom portion P2*b*. The film thickness of the barrier metal film 226-*y* on each of the side surfaces of the via portion V2 and the bottom portion P2*b* is equal to or more than 0.1 times and less than 0.5 times the film thickness of the barrier metal film 226-*y* on each of the lower surfaces of the via portion V2 and the bottom portion P2*b*. Within the above-described range of the film thickness, the film thickness of the barrier metal film 226-*y* on each of the via portion V2 and the bottom portion P2*b* may be changed depending on the distance from the bonding surface, or may be substantially uniform. The upper end of the barrier metal film 226-*y* is cut at the interface portion P2*a* without reaching the bonding surface. Hereinafter, the feature of the film thickness applied to the barrier metal film 226-*y* is also referred to as a "film thickness pattern D".

The barrier metal film 227-*y* is a single-layer conductive film covering the inside of the barrier metal film 226-*y*. The upper end of the barrier metal film 227-*y* reaches the bonding surface. The barrier metal film 227-*y* is provided between the barrier metal film 226-*y* and the core metal film 228-*y* and between the insulating layer 230 and a portion belonging to the interface portion P2*a* of the core metal film 228-*y*. The barrier metal film 227-*y* contains, for example, a film type different from that of the barrier metal film 226-*y* among titanium, tantalum, and tantalum nitride. The barrier metal film 227-*y* has a function of reducing the diffusion of the core metal film 228-*y* into the insulating layer 230 and the like, together with the barrier metal film 226-*y*. That is, the barrier metal films 226-*y* and 227-*y* are conductive films in a stack covering the entire surface excluding the bonding surface of the core metal film 228-*y*.

In the first example of the third embodiment, the barrier metal film 227-1 has a film thickness pattern A. In the second example of the third embodiment, the barrier metal film 227-2 has a film thickness pattern B. In the third example of the third embodiment, the barrier metal film 227-3 has a film thickness pattern C.

The core metal film 228-*y* is a conductive film filling the inside of the barrier metal film 227-*y*. The core metal film 228-*y* contains, for example, copper. The (111) orientation ratio of copper in the portion belonging to the interface portion P2*a* of the core metal film 228-*y* is higher than the (111) orientation ratio of copper in the portion belonging to the via portion V2 and the bottom portion P2*b* of the core metal film 228-*y*.

As described above, in the first to third examples of the third embodiment, a structure is provided in which one layer of the barrier metal film 227-*y* is provided between the portion belonging to the interface portion P2*a* of the core metal film 228-*y* and the insulating layer 230 and two layers of the barrier metal films 226-*y* and 227-*y* are provided between the portion belonging to the bottom portion P2*b* and the via portion V2 of the core metal film 228-*y* and the insulating layer 230.

Fourth Example to Sixth Example

Figure 22:
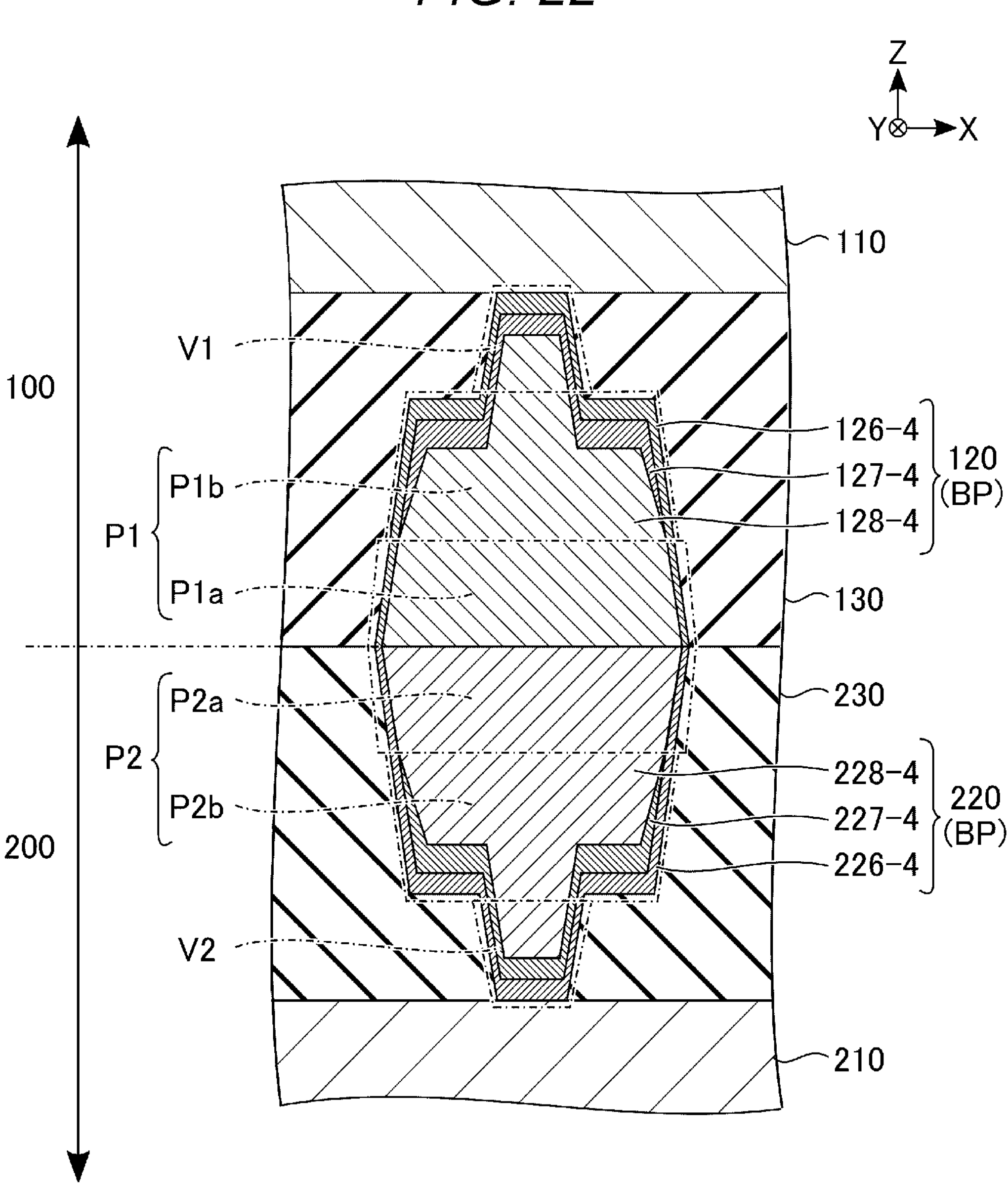
FIG. 22 is a cross-sectional view showing a fourth example of a cross-sectional structure of a bonding pad of the memory device according to a third embodiment.
Figure 23:
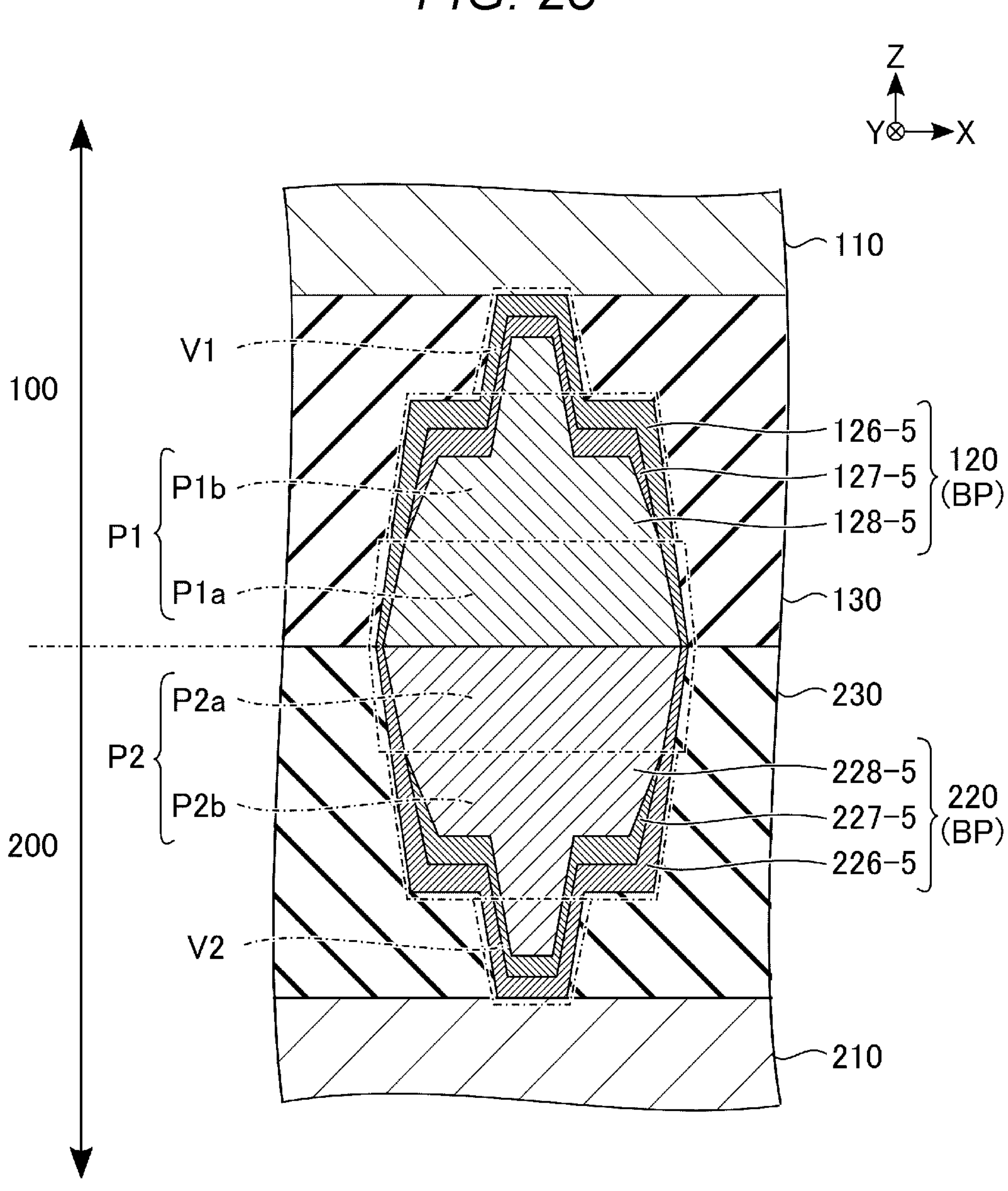
FIG. 23 is a cross-sectional view showing a fifth example of a cross-sectional structure of a bonding pad of the memory device according to a third embodiment.
Figure 24:
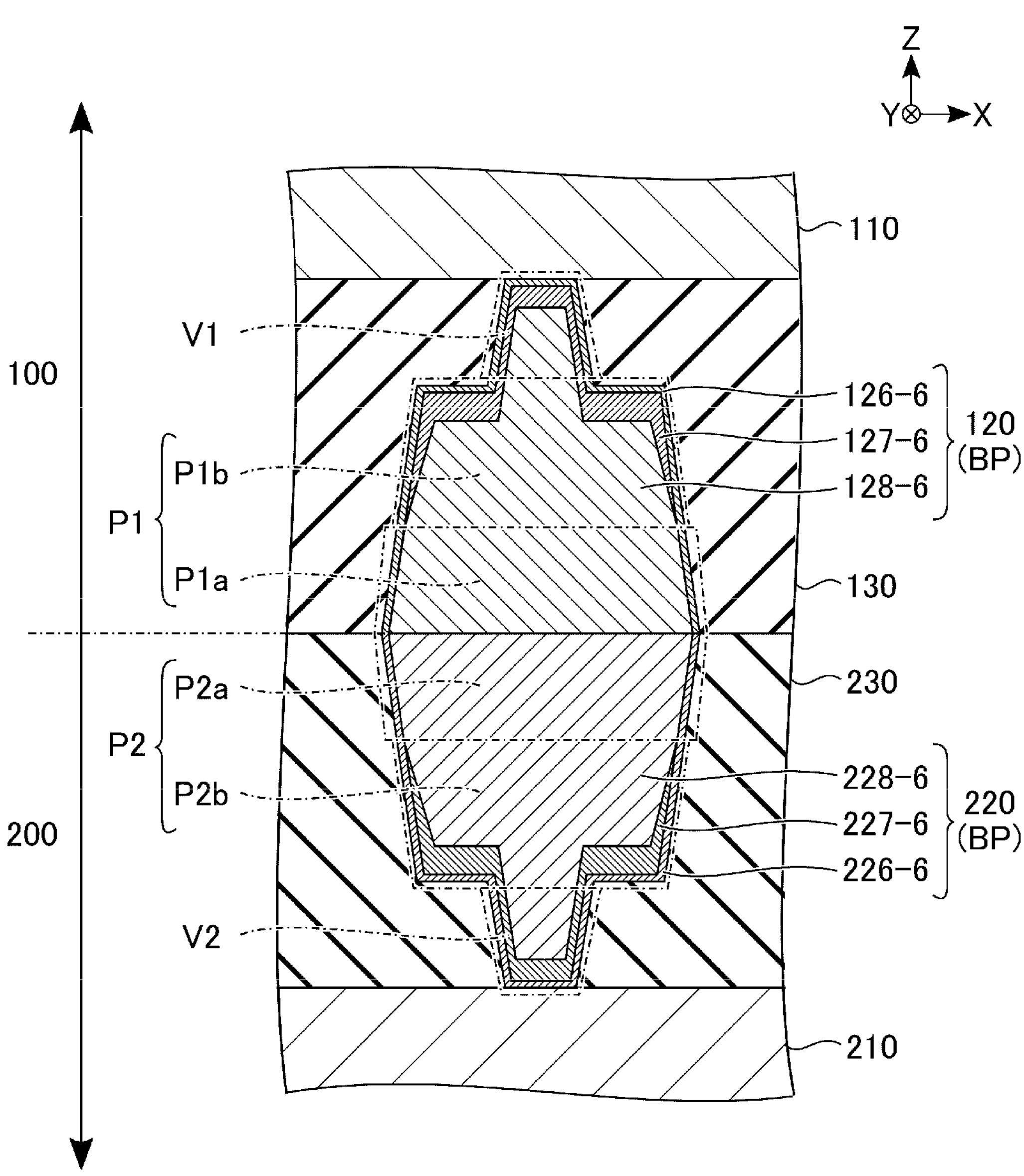
FIG. 24 is a cross-sectional view showing a sixth example of a cross-sectional structure of a bonding pad of the memory device according to a third embodiment.

FIG. 22 is a cross-sectional view showing a fourth example of a cross-sectional structure of a bonding pad of the memory device according to a third embodiment. FIG. 23 is a cross-sectional view showing a fifth example of a cross-sectional structure of a bonding pad of the memory device according to a third embodiment. FIG. 24 is a cross-sectional view showing a sixth example of a cross-sectional structure of a bonding pad of the memory device according to a third embodiment.

As shown in FIGS. 22 to 24, the electrode 120 in the z-th example of the third embodiment includes barrier metal films 126-*z* and 127-*z* and a core metal film 128-*z*. The electrode 220 in the z-th example of the third embodiment includes the barrier metal films 226-*z* and 227-*z* and the core metal film 228-*z* (4≤z≤6).

Hereinafter, matters common to all of the fourth example of the third embodiment to the sixth example of the third embodiment will be described by adding "-z" to the element. Individual matters of the fourth example of the third embodiment to the sixth example of the third embodiment will be described by adding any of "-4" to "-6" to the elements.

The barrier metal film 226-*z* is a single-layer conductive film covering the side surface of the portion belonging to the interface portion P2*a* of the core metal film 228-*z*, the side surface of the portion belonging to the via portion V2 and the bottom portion P2*b* of the barrier metal film 227-*z*, and the lower surface of the barrier metal film 227-*z*. The upper end of the barrier metal film 226-*z* reaches the bonding surface. The barrier metal film 226-*z* is provided between the portion belonging to the interface portion P2*a* of the core metal film 228-*z* and the insulating layer 230, between the barrier metal film 227-*z* and the insulating layer 230, and between the barrier metal film 227-*z* and the wiring layer 210. The barrier metal film 226-*z* contains, for example, titanium, tantalum, or tantalum nitride. The barrier metal film 226-*z* has a function of reducing the diffusion of the core metal film 228-*z* into the insulating layer 230 and the like.

In the fourth example of the third embodiment, the barrier metal film 226-4 has a film thickness pattern A. In the fifth example of the third embodiment, the barrier metal film 227-5 has a film thickness pattern B. In the sixth example of the third embodiment, the barrier metal film 227-6 has a film thickness pattern C.

The barrier metal film 227-*z* is a single-layer conductive film covering the inside of the portion belonging to the bottom portion P2*b* and the via portion V2 of the barrier metal film 226-*z*. The barrier metal film 227-*z* has a film thickness pattern D. That is, the upper end of the barrier metal film 227-*z* is cut at the interface portion P2*a* without reaching the bonding surface. The barrier metal film 227-*z* is provided between a portion belonging to the bottom portion P2*b* and the via portion V2 of the barrier metal film 226-*z* and a portion belonging to the bottom portion P2*b* and the via portion V2 of the core metal film 228-*z*. The barrier metal film 227-*z* contains, for example, a film type different from that of the barrier metal film 226-*z* among titanium, tantalum, and tantalum nitride. The barrier metal film 227-*z* has a function of reducing the diffusion of the core metal film 228-*z* into the insulating layer 230 and the like, together with the barrier metal film 226-*z*. That is, the barrier metal films 226-*z* and 227-*z* are conductive films in a stack covering the entire surface excluding the bonding surface of the core metal film 228-*z*.

The core metal film 228-*z* is a conductive film filling the inside of the barrier metal film 227-*z* and the inside of a portion belonging to the interface portion P2*a* of the barrier metal film 226-*z*. The core metal film 228-*z* contains, for example, copper. The (111) orientation ratio of copper in the portion belonging to the interface portion P2*a* of the core metal film 228-*z* is higher than the (111) orientation ratio of copper in the portion belonging to the via portion V2 and the bottom portion P2*b* of the core metal film 228-*z*.

As described above, in the fourth to sixth examples of the third embodiment, a structure is provided in which one layer of the barrier metal film 226-*z* is provided between the portion belonging to the interface portion P2*a* of the core metal film 228-*z* and the insulating layer 230 and two layers of the barrier metal films 226-*z* and 227-*z* are provided between the portion belonging to the bottom portion P2*b* and the via portion V2 of the core metal film 228-*z* and the insulating layer 230.

3.2 Effects of Third Embodiment

According to the third embodiment described above, the bonding pad BP has one barrier metal film 226 or 227 at the interface portion P2*a*, and has two-layer barrier metal films 226 and 227 at the bottom portion P2*b* and the via portion V2. Accordingly, the (111) orientation ratio of copper contained in the core metal film 228 can be made different between the portion belonging to the interface portion P2*a* and the portion belonging to the bottom portion P2*b* and the via portion V2.

Moreover, at the time of forming the core metal film 228, the (111) orientation ratio of copper contained in the core metal film 228 changes according to the number of layers of the barrier metal films 226 and 227 at the position which is the base point of the copper film formation. Specifically, the (111) orientation ratio of copper film-formed from a position where one layer of the barrier metal films 226 and 227 is provided as a base point is higher than the (111) orientation ratio of copper film-formed from a position where two layers of the barrier metal films 226 and 227 are stacked as a base point. As a result, the (111) orientation ratio of copper contained in the portion belonging to the interface portion P2*a* of the core metal film 228 is higher than the (111) orientation ratio of copper contained in the portion belonging to the bottom portion P2*b* and the via portion V2 of the core metal film 228.

In addition, in any case of the first to sixth examples of the third embodiment, the portion belonging to the via portion V2 and the bottom portion P2*b* of the core metal film 228 is located close to the lower surface of the via portion V2 and the lower surface of the bottom portion P2*b* having a relatively thick total film thickness of the barrier metal film. Therefore, the (111) orientation ratio of copper contained in the portion belonging to the via portion V2 and the bottom portion P2*b* of the core metal film 228 is relatively low. On the other hand, a portion belonging to the interface portion P2*a* of the core metal film 228 is located at a position far from the lower surface of the via portion V2 and the lower surface of the bottom portion P2*b* having a relatively thick total film thickness of the barrier metal film. Therefore, the (111) orientation ratio of copper contained in the portion belonging to the interface portion P2*a* of the core metal film 228 becomes relatively high. That is, the (111) orientation ratio of copper in the portion belonging to the interface portion P2*a* of the core metal film 228 is higher than the (111) orientation ratio of copper in the portion belonging to the via portion V2 and the bottom portion P2*b* of the core metal film 228. As a result, similar to the first embodiment and the second embodiment, it is possible to easily cause diffusion of copper in the portion belonging to the interface portion P2*a* of the core metal film 228 and to easily cause thermal expansion of copper in the portion belonging to the bottom portion P2*b* and the via portion V2 of the core metal film 228. Therefore, it is possible to reduce the occurrence of a gap between the core metal films 128 and 228 in the bonding step, and thus, it is possible to reduce the occurrence of an open failure during energization.

4. EXAMPLES

Next, examples related to the first embodiment, the second embodiment, and the third embodiment described above will be described. In each of the examples shown below, the measurement results of the (111) orientation ratio of copper contained in the core metal film are shown for each measurement condition. In addition, in each of the examples shown below, the measurement results of the measurement conditions in two cases, that is, before the heat treatment after the film formation of copper and after performing the heat treatment on copper, are shown.

4.1 First Example

Figure 25:
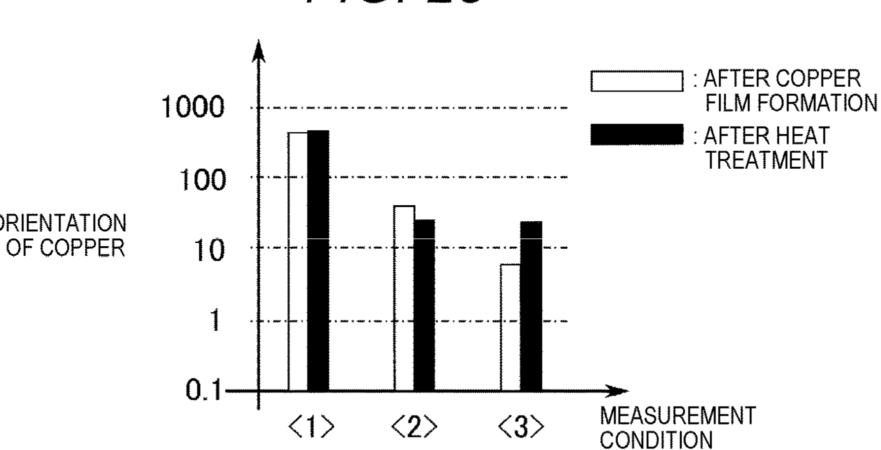
FIG. 25 is a graph showing a measurement result of a (111) orientation ratio of copper contained in the first example of the embodiments.

FIG. 25 is a graph showing a measurement result of the (111) orientation ratio of copper according to the first example. FIG. 25 shows the (111) orientation ratio of copper contained in the core metal film when the core metal film is formed on a single-layer barrier metal film. The measurement condition <1> corresponds to a case where a titanium film having a thickness of 9 nm is provided as the barrier metal film. The measurement condition <2> corresponds to a case where a titanium film having a thickness of 18 nm is provided as the barrier metal film. The measurement condition <3> corresponds to a case where a titanium film having a thickness of 27 nm is provided as the barrier metal film.

As shown in FIG. 25, when a single-layer barrier metal film is provided, the thinner the film thickness of the barrier metal film, the higher the (111) orientation ratio of copper contained in the corresponding core metal film. Therefore, according to the bonding pad BP of the first embodiment, it is seen that the (111) orientation ratio of copper contained in the core metal film is higher in the interface portion P2*a* than that in the bottom portion P2*b* and the via portion V2.

4.2 Second Example

Figure 26:
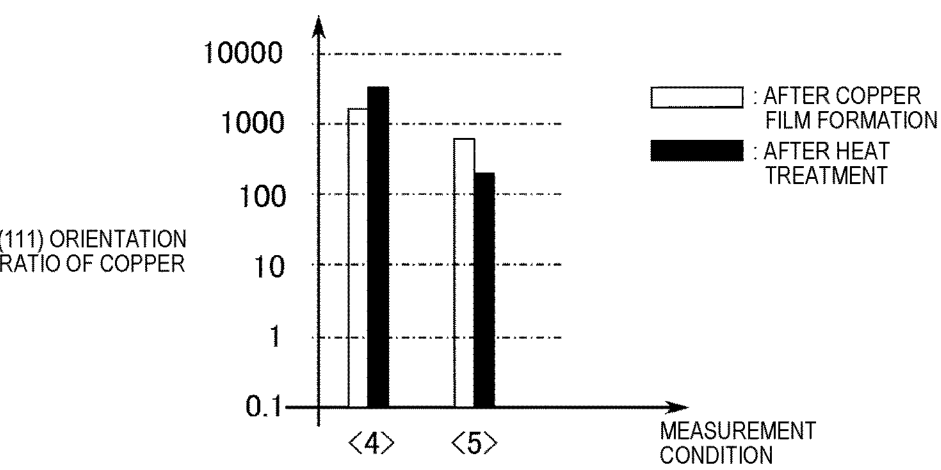
FIG. 26 is a graph showing a measurement result of a (111) orientation ratio of copper contained in the second example of the embodiments.

FIG. 26 is a graph showing a measurement result of a (111) orientation ratio of copper according to the second example. FIG. 26 shows the (111) orientation ratio of copper contained in the core metal film when the core metal film is formed on the two-layer barrier metal film. The measurement condition <4> corresponds to a case where a tantalum film having a film thickness of 18 nm is provided as the first layer (that is, the outer side with respect to the core metal film) of the barrier metal film, and a titanium film having a film thickness of 5 nm is provided as the second layer (that is, the inner side with respect to the core metal film) of the barrier metal film. The measurement condition <5> corresponds to a case where a tantalum film having a film thickness of 18 nm is provided as the first layer of the barrier metal film and a titanium film having a film thickness of 10 nm is provided as the second layer of the barrier metal film.

As shown in FIG. 26, when two-layer barrier metal film is provided, the lower the total film thickness of the barrier metal film, the higher the (111) orientation ratio of copper contained in the corresponding core metal film. Therefore, according to the bonding pad BP of the second embodiment, it is seen that the (111) orientation ratio of copper contained in the core metal film is higher in the interface portion P2*a* than that in the bottom portion P2*b* and the via portion V2.

4.3 Third Example

Figure 27:
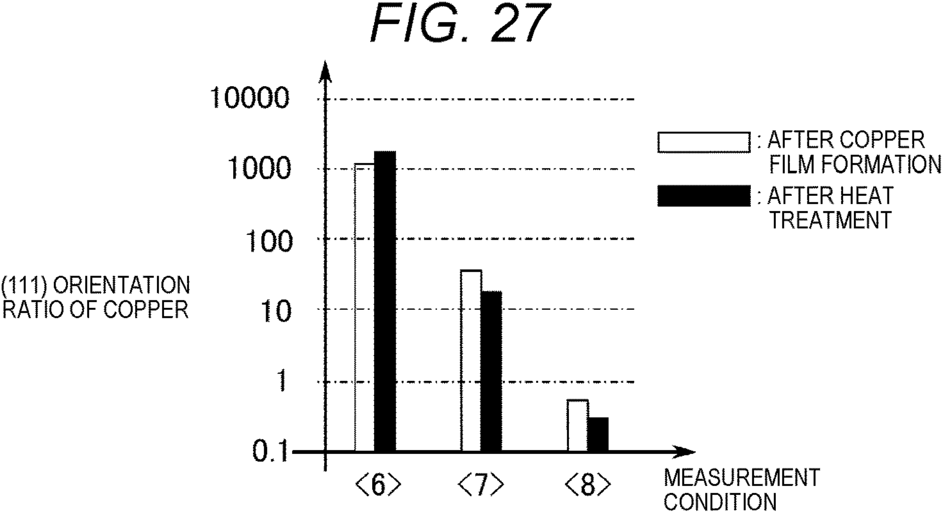
FIG. 27 is a graph showing a measurement result of a (111) orientation ratio of copper contained in the third example of the embodiments.

FIG. 27 is a graph showing the measurement results of the (111) orientation ratio of copper according to the third example. In FIG. 27, the (111) orientation ratio of copper contained in the core metal film is shown in each of the case where the core metal film is formed on the single-layer barrier metal film and the case where the core metal film is formed on the two-layer barrier metal film. The measurement condition <6> corresponds to a case where a tantalum film having a thickness of 9 nm is provided as a single-layer barrier metal film. The measurement condition <7> corresponds to a case where a tantalum nitride film having a film thickness of 9 nm is provided as the first layer of the barrier metal film and a tantalum film having a film thickness of 9 nm is provided as the second layer of the barrier metal film. The measurement condition <8> corresponds to a case where a tantalum nitride film having a film thickness of 9 nm is provided as the first layer of the barrier metal film and a titanium film having a film thickness of 18 nm is provided as the second layer of the barrier metal film.

As shown in FIG. 27, when a single-layer barrier metal film is provided, the (111) orientation ratio of copper contained in the corresponding core metal film is higher than that when a two-layer barrier metal film is provided. In addition, as in the second example, when two-layer barrier metal film is provided, the thinner the total film thickness of the barrier metal film, the higher the (111) orientation ratio of copper contained in the corresponding core metal film. Therefore, according to the bonding pad BP of the third embodiment, it is seen that the (111) orientation ratio of copper contained in the core metal film is higher in the interface portion P2*a* than that in the bottom portion P2*b* and the via portion V2.

5. OTHERS

In the first embodiment, the second embodiment, and the third embodiment described above, a case where the bonding pad BP on the memory chip 100 side and the bonding pad BP on the circuit chip 200 side have the same configuration has been described, but the present disclosure is not limited thereto. For example, the bonding pad BP on the memory chip 100 side and the bonding pad BP on the circuit chip 200 side may have different configurations from each other. In this case, any configuration from the first embodiment, the modification example of the first embodiment, the first to eighth examples of the second embodiment, and the first to sixth examples of the third embodiment may be applied to each of the bonding pad BP on the memory chip 100 side and the bonding pad BP on the circuit chip 200 side.

In addition, in the first embodiment, the second embodiment, and the third embodiment described above, the case where the bonding pads BP having a configuration in which the (111) orientation ratio of copper of the interface portions P1*a* and P2*a* is higher than the (111) orientation ratio of copper of each of the bottom portions P1*b* and P2*b* and the via portions V1 and V2 are applied to both the memory chip 100 side and the circuit chip 200 side has been described, but the present disclosure is not limited thereto. For example, the bonding pad BP having a configuration in which the (111) orientation ratio of copper of the interface portion P1*a* (or P2*a*) is higher than the (111) orientation ratio of copper of the bottom portion P1*b* (or P2*b*) and the via portion V1 (or V2) may be applied only to one of the memory chip 100 or the circuit chip 200.

In addition, in the first embodiment, the second embodiment, and the third embodiment described above, the case where the bonding pads BP having a configuration in which the (111) orientation ratio of copper of the interface portions P1*a* and P2*a* is higher than the (111) orientation ratio of copper of each of the bottom portions P1*b* and P2*b* and the via portions V1 and V2 are applied to the memory device 3 in which the memory chip 100 and the circuit chip 200 are bonded to each other has been described, but the present disclosure is not limited thereto. The bonding pad BP having a configuration in which the (111) orientation ratio of copper of each of the interface portions P1*a* and P2*a* is higher than the (111) orientation ratio of copper of each of the bottom portions P1*b* and P2*b* and the via portions V1 and V2 may also be applied to a semiconductor device in which memory chips are bonded to each other and a semiconductor device in which circuit chips are bonded to each other.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:

a first chip including a first electrode; and a second chip including a second electrode, wherein the first electrode includes a first conductive film having a first surface in contact with the second electrode at a boundary region of the first and second electrodes, a second surface spaced apart from the boundary region, and a third surface between the first surface and the second surface, and a second conductive film covering the second surface and the third surface of the first conductive film, and a (111) orientation ratio of copper contained in a first portion of the first conductive film on a first surface side is higher than a (111) orientation ratio of copper contained in a second portion of the first conductive film on a second surface side.

2. The semiconductor device according to claim 1, wherein the second conductive film includes a third portion covering the second surface and a fourth portion covering the third surface, and a film thickness of the third portion is greater than a film thickness of the fourth portion.

3. The semiconductor device according to claim 2, wherein the second conductive film is a single-layer film, and the fourth portion includes a first sub-portion covering the third surface that is also a surface of the first portion and a second sub-portion covering the third surface that is also a surface of the second portion.

4. The semiconductor device according to claim 3, wherein the film thickness of the fourth portion is equal to or more than 0.1 times and less than 0.5 times the film thickness of the third portion.

5. The semiconductor device according to claim 3, wherein a film thickness of the first sub-portion is equal to or more than 0.1 times and less than 0.5 times the film thickness of the third portion, and a film thickness of the second sub-portion is equal to or more than 0.3 times and less than 1.0 time the film thickness of the third portion.

6. The semiconductor device according to claim 3, wherein the second conductive film contains titanium, tantalum, or tantalum nitride.

7. The semiconductor device according to claim 2, wherein the second conductive film includes two stacked conductive films, and the fourth portion includes a first sub-portion covering the third surface that is also a surface of the first portion and a second sub-portion covering the third surface that is also a surface of the second portion.

8. The semiconductor device according to claim 7, wherein a film thickness of at least one of the two stacked conductive films in the fourth portion is equal to or more than 0.1 times and less than 0.5 times a film thickness of the at least one of the two stacked conductive films in the third portion.

9. The semiconductor device according to claim 8, wherein a film thickness of one of the two stacked conductive films is substantially uniform over the third portion and the fourth portion.

10. The semiconductor device according to claim 7, wherein a film thickness of at least one of the two stacked conductive films in the first sub-portion is equal to or more than 0.1 times and less than 0.5 times a film thickness of the at least one of the two stacked conductive films in the third portion, and a film thickness of the at least one of the two stacked conductive films in the second sub-portion is equal to or more than 0.3 times and less than 1.0 time the film thickness of the at least one of the two stacked conductive films in the third portion.

11. The semiconductor device according to claim 10, wherein a film thickness of one of the two stacked conductive films is substantially uniform over the third portion and the fourth portion.

12. The semiconductor device according to claim 7, wherein one of the two stacked conductive films terminates in the first sub-portion and does not extend to the first surface.

13. The semiconductor device according to claim 12, wherein a film thickness of the one of the two stacked conductive films in the second sub-portion is equal to or more than 0.1 times and less than 0.5 times a film thickness of the one of the two stacked conductive films in the third portion.

14. The semiconductor device according to claim 12, wherein a film thickness of the other of the two stacked conductive films is substantially uniform over the third portion and the fourth portion.

15. The semiconductor device according to claim 12, wherein a film thickness of the other of the two stacked conductive films in the third portion is greater than a film thickness of the other of the two stacked conductive films in the fourth portion.

16. The semiconductor device according to claim 7, wherein a first of the two stacked conductive films contains titanium, tantalum, or tantalum nitride, and a second of the two stacked conductive films contains a film type different from a film type of the first of the two stacked conductive films among titanium, tantalum, and tantalum nitride.

17. The semiconductor device according to claim 1, wherein the third surface of the first conductive film includes two surfaces, a first one of which is a surface of the first portion of the first conductive film and a second one of which is a surface of the second portion of the first conductive film, and the first of the two surfaces is aligned with an extension of the second of the two surfaces.

18. The semiconductor device according to claim 1, wherein a thermal expansion coefficient of the copper contained in the first portion is lower than a thermal expansion coefficient of the copper contained in the second portion.

19. The semiconductor device according to claim 1, wherein a diffusion rate of the copper contained in the first portion is higher than a diffusion rate of the copper contained in the second portion.

20. The semiconductor device according to claim 1, wherein at least one of the first chip and the second chip includes a memory cell array.

* * * * *